United States Patent
Kim et al.

(10) Patent No.: US 11,137,838 B2
(45) Date of Patent: Oct. 5, 2021

(54) ELECTRONIC DEVICE FOR STORING USER DATA, AND METHOD THEREFOR

(71) Applicant: Samsung Electronics Co., Ltd., Suwon-si (KR)

(72) Inventors: Kyung-Hwa Kim, Seoul (KR); Hee-Woon Kim, Suwon-si (KR); Hyung-Joo Jin, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/098,953

(22) PCT Filed: May 18, 2017

(86) PCT No.: PCT/KR2017/005184
§ 371 (c)(1),
(2) Date: Nov. 5, 2018

(87) PCT Pub. No.: WO2017/200323
PCT Pub. Date: Nov. 23, 2017

(65) Prior Publication Data
US 2019/0087024 A1 Mar. 21, 2019

(30) Foreign Application Priority Data

May 18, 2016 (KR) .................. 10-2016-0060852

(51) Int. Cl.
*G06F 3/0354* (2013.01)
*G06F 3/0485* (2013.01)
(Continued)

(52) U.S. Cl.
CPC ........ *G06F 3/03545* (2013.01); *G06F 3/0354* (2013.01); *G06F 3/0482* (2013.01);
(Continued)

(58) Field of Classification Search
CPC .. G06F 3/0354; G06F 3/03545; G06F 3/0482; G06F 3/0485; G06F 3/0488; G06F 3/04883; H03K 17/945; H03K 17/96
(Continued)

(56) References Cited

U.S. PATENT DOCUMENTS

2008/0092038 A1* 4/2008 Audet .................... G06F 16/00
715/243
2012/0075267 A1* 3/2012 Akifusa ............. H04N 5/23293
345/204
(Continued)

FOREIGN PATENT DOCUMENTS

EP 1564632 A2 8/2005
KR 10-2012-0075845 A 7/2012
(Continued)

OTHER PUBLICATIONS

European Search Report dated Feb. 22, 2019, issued in European Patent Application No. 17799680.8.

*Primary Examiner* — Kwin Xie
(74) *Attorney, Agent, or Firm* — Jefferson IP Law, LLP

(57) ABSTRACT

A method for storing user data according to various embodiments comprises the steps of: receiving a first event signal from an electronic pen; when a first pen input through the electronic pen is detected on a display area where first screen data is displayed, during a first mode operation performed on the basis of the first event, generating first user data according to the first pen input; displaying second screen data on the display area on the basis of a user input on the display area; when a second pen input through the electronic pen is detected on the display area where the second screen data is displayed, generating second user data according to the second pen input; receiving, from the electronic pen, a second event signal corresponding to the first event signal; and storing the first user data and the second user data that (Continued)

are associated with each other, during a second mode operation performed on the basis of the second event signal.

15 Claims, 14 Drawing Sheets

(51) Int. Cl.
- *G06F 3/0488* (2013.01)
- *G06F 3/0482* (2013.01)
- *H03K 17/945* (2006.01)
- *H03K 17/96* (2006.01)
- *G06F 3/033* (2013.01)

(52) U.S. Cl.
CPC .......... *G06F 3/0485* (2013.01); *G06F 3/0488* (2013.01); *G06F 3/04883* (2013.01); *H03K 17/945* (2013.01); *H03K 17/96* (2013.01)

(58) Field of Classification Search
USPC .................................................. 345/173–174
See application file for complete search history.

(56) References Cited

U.S. PATENT DOCUMENTS

| | | | |
|---|---|---|---|
| 2014/0075281 A1* | 3/2014 | Rubin | G06F 17/241 715/230 |
| 2014/0101576 A1* | 4/2014 | Kwak | G06F 1/1643 715/761 |
| 2014/0125606 A1 | 5/2014 | Namkung | |
| 2014/0298244 A1 | 10/2014 | Kim | |
| 2015/0100876 A1 | 4/2015 | Neugebauer et al. | |
| 2015/0338938 A1 | 11/2015 | Vong | |
| 2017/0017388 A1* | 1/2017 | Heo | G06F 3/0346 |
| 2017/0192737 A1* | 7/2017 | Mabey | H04L 67/025 |

FOREIGN PATENT DOCUMENTS

| | | |
|---|---|---|
| KR | 10-2014-0056959 A | 5/2014 |
| KR | 10-2015-0069486 A | 6/2015 |
| KR | 10-1554185 B1 | 9/2015 |
| WO | 2012/108697 A2 | 8/2012 |
| WO | 2015/005674 A1 | 10/2015 |
| WO | 2016/037017 A1 | 3/2016 |

\* cited by examiner (a) (b) (c) (d)

ELECTRONIC DEVICE FOR STORING USER DATA, AND METHOD THEREFOR

CROSS-REFERENCE TO RELATED APPLICATION(S)

This application is a National Phase Entry of PCT International Application No. PCT/KR2017/005184, which was filed on May 18, 2017 and claims priority under 35 U.S.C. § 119 of Korean Patent Application No. 10-2016-0060852, filed on May 18, 2016, in the Korean Intellectual Property Office the disclosure of which is incorporated herein by reference in its entirety.

TECHNICAL FIELD

This disclosure relates to an electronic device and method for storing user data, and more specifically, to a method for storing user data generated corresponding to a pen input using an electronic pen and an electronic device that uses the method.

BACKGROUND ART

Along with technological development, a user input using an electronic pen, in addition to existing touch input, has become a possible input for an electronic device.

It is also possible to not only make a user input using an electronic pen, but also to generate an event signal from the electronic pen to an electronic device by manipulating a member included in the electronic pen.

For example, upon receiving the event signal from the electronic pen by manipulating the member included in the electronic pen, the electronic device may provide a menu for selecting at least one function executable by a pen input according to the received event signal.

DETAILED DESCRIPTION OF THE INVENTION

Technical Problem

Conventionally, a user manipulates a member included in an electronic pen to input a memo using the electronic pen, such that the electronic device displays a menu executable by a pen input, and the user selects a memo function from the displayed menu, performs the pen input, and selects a store button to store the input memo; then user data corresponding to the pen input is generated and stored.

However, such a series of operations needs complex preceding operations for even a simple memo, largely deteriorating user convenience.

Technical Solution

According to various embodiments of the disclosure, a method for storing user data corresponding to an input using an electronic pen by an electronic device which provides a display region includes receiving a first event signal from the electronic pen, generating first user data corresponding to a first pen input, upon sensing the first pen input using the electronic pen against the display region where first screen data is displayed when the electronic device operates in a first mode based on the first event signal, displaying second screen data in the display region based on a user input against the display region, generating second user data corresponding to a second pen input, upon sensing the second pen input using the electronic pen against the display region where second screen data is displayed, receiving a second event signal corresponding to the first event signal from the electronic pen, and storing the first user data associatively with the second user data while the electronic device operates in a second mode based on the second event signal.

According to various embodiments of the disclosure, an electronic device includes a display providing a display region, a pen sensing module configured to sense a pen input using an electronic pen, a processor electrically connected to the display and the pen sensing module, and a memory electrically connected to the processor, in which the memory stores instructions for causing the processor, when executed, to generate first user data corresponding to a first pen input when the pen sensing module senses the first pen input using the electronic pen against the display region where first screen data is displayed, while operating in a first mode based on a first event signal received from the electronic pen, to display second screen data in the display region based on a user input against the display region, to generate second user data corresponding to a second pen input when the pen sensing module senses the second pen input using the electronic pen against the display region where second screen data is displayed, and to store the first user data associatively with the second user data in the memory while operating in a second mode based on a second event signal corresponding to the first event signal received from the electronic pen.

According to various embodiments of the disclosure, a recording medium has stored thereon a program for storing user data corresponding to an input using an electronic pen, in which the program includes receiving a first event signal from the electronic pen, generating first user data corresponding to a first pen input, upon sensing the first pen input using the electronic pen against the display region where first screen data is displayed when the electronic device operates in a first mode based on the first event signal, displaying second screen data in the display region based on a user input against the display region, generating second user data corresponding to a second pen input, upon sensing the second pen input using the electronic pen against the display region where second screen data is displayed, receiving a second event signal corresponding to the first event signal from the electronic pen, and storing the first user data associatively with the second user data while the electronic device operates in a second mode based on the second event signal.

Advantageous Effects

According to various embodiments of the disclosure, an electronic device immediately enters a mode where a user may input a memo based on a first event signal received from an electronic pen, and the memo input by the user is stored based on a second event signal corresponding to the first event signal in the electronic pen, thereby forming the optimal environment for recording a user's memo.

Moreover, when a first pen input is performed while first screen data is displayed and a second pen input is performed while second screen data is displayed, the electronic device stores first user data corresponding to the first pen input associatively with second user data corresponding to the second pen input, such that when executing stored user data later, the user may easily identify the association between user data.

Other effects obtained or expected from embodiments of the disclosure will be directly or implicitly disclosed in the detailed description of the embodiments of the disclosure. For example, various effects expected according to embodiments of the disclosure will be disclosed in the detailed description to be made below.

MODE FOR CARRYING OUT THE INVENTION

Figure 1A:
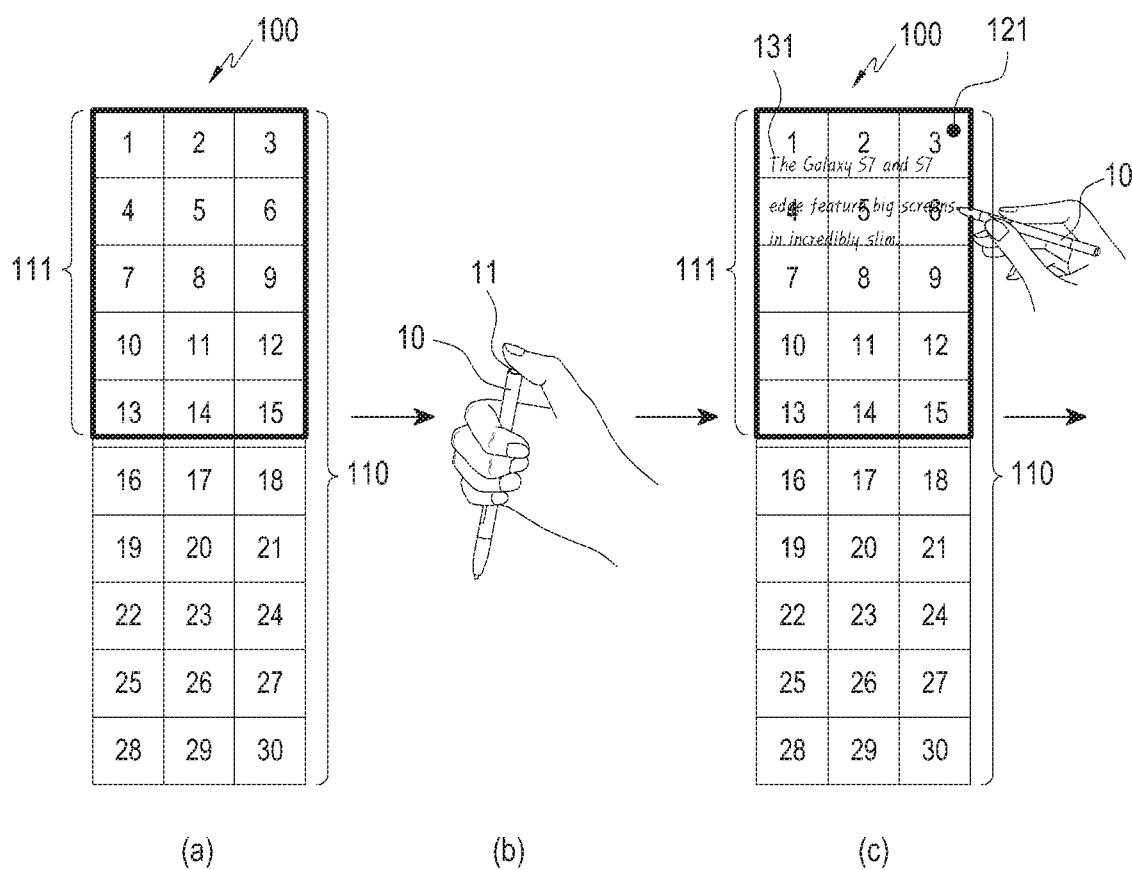
FIGS. 1A to 1C show screens for storing user data according to various embodiments of the disclosure.

Hereinafter, various embodiments of the disclosure will be disclosed with reference to the accompanying drawings. However, the description is not intended to limit the disclosure to particular embodiments, and it should be construed as including various modifications, equivalents, and/or alternatives according to the embodiments of the disclosure. With regard to the description of the drawings, similar reference numerals may be used to refer to similar or related elements.

In the disclosure, an expression such as "having," "may have," "comprising," or "may comprise" indicates existence of a corresponding characteristic (e.g., a numerical value, a function, an operation, or an element like a part) and does not exclude existence of additional characteristic.

in the disclosure, an expression such as "A or B," "at least one of A or/and B," or "one or more of A or/and B" may include all possible combinations of together listed items. For example, "A or B," "at least one of A and B," or "one or more of A or. B" may indicate the entire of (1) including at least one A, (2) including at least one B, or (3) including both at least one A and at least one B.

Expressions such as "first," "second," "primarily," or "secondary," used herein may represent various elements regardless of order and/or importance and do not limit corresponding elements. For example, a first user device and a second user device may represent different user devices regardless of order or importance. For example, a first element may be named as a second element without departing from the right scope of the various exemplary embodiments of the disclosure, and similarly, a second element may be named as a first element.

When it is described that an element (such as a first element) is "operatively or communicatively coupled with/ to" or "connected" to another element (such as a second element), the element can be directly connected to the other element or can be connected to the other element through another element (e.g., a third element). However, when it is described that an element (e.g., a first element) is "directly connected" or "directly coupled" to another element (e.g., a second element), it means that there is no intermediate element (e.g., a third element) between the element and the other element.

An expression "configured to (or set)" used in the disclosure may be replaced with, for example, "suitable for," "having the capacity to," "designed to," "adapted to," "made to," or "capable of" according to a situation. A term "configured to (or set)" does not always mean only "specifically designed to" by hardware. Alternatively, in some situation, an expression "apparatus configured to" may mean that the apparatus "can" operate together with another apparatus or component. For example, a phrase "a processor configured (or set) to perform A, B, and C" may be a dedicated processor (e.g., an embedded processor) for performing a corresponding operation or a generic-purpose processor (such as a central processing unit (CPU) or an application processor) that can perform a corresponding operation by executing at least one software program stored at a memory device.

Terms defined in the disclosure are used for only describing a specific exemplary embodiment and may not have an intention to limit the scope of other exemplary embodiments. It is to be understood that a singular form of a noun corresponding to an item may include one or more of the things, unless the relevant context clearly indicates otherwise. All of the terms used herein including technical or scientific terms have the same meanings as those generally understood by an ordinary skilled person in the related art. The terms defined in a generally used dictionary should be interpreted as having meanings that are the same as or similar with the contextual meanings of the relevant technology and should not be interpreted as having ideal or exaggerated meanings unless they are clearly defined in the various exemplary embodiments. In some case, terms defined in the disclosure cannot be analyzed to exclude the present exemplary embodiments.

An electronic device according to various embodiments of the disclosure may include at least one of, for example, a smartphone, a tablet personal computer (PC), a mobile phone, a video phone, an electronic-book (e-book) reader, a desktop PC, a laptop PC, a netbook computer, a workstation, a server, a personal digital assistant (PDA), a portable multimedia player (PMP), an MP3 player, a mobile medical equipment, a camera, and a wearable device. According to various embodiments, examples of the wearable device may include at least one of an accessory type (e.g., a watch, a ring, a bracelet, an anklet, a necklace, glasses, contact lenses, head-mounted device (HMD), etc.), a fabric or cloth-integrated type (e.g., electronic clothing, etc.), a body-attached type (e.g., a skin pad, a tattoo, etc.), a body implanted type (e.g., an implantable circuit, etc.), and so forth.

According to some embodiments, the electronic device may be a home appliance. The home appliance may include, for example, a television (TV), a digital video disk (DVD) player, audio equipment, a refrigerator, an air conditioner, a vacuum cleaner, an oven, a microwave oven, a laundry machine, an air cleaner, a set-top box, a home automation control panel, a security control panel, a TV box (e.g., Samsung HomeSync™, Apple TV™, or Google TV™) a game console, an electronic dictionary, an electronic key, a camcorder, and an electronic frame.

According to other embodiments of the disclosure, the electronic device may include at least one of various medical equipment (for example, magnetic resonance angiography (MRA), magnetic resonance imaging (MRI), computed tomography (CT), an imaging device, or an ultrasonic device), a navigation system, a global navigation satellite system (GNSS), an event data recorder (EDR), a flight data recorder (FDR), a vehicle infotainment device, electronic equipment for ships (e.g., a navigation system and gyro compass for ships), avionics, a security device, a vehicle head unit, an industrial or home robot, an automatic teller's machine (ATM), a point of sales (POS), Internet of things (e.g., electric bulbs, various sensors, electricity or gas meters, sprinkler devices, fire alarm devices, thermostats, streetlights, toasters, exercise machines, hot-water tanks, heaters, boilers, and so forth).

According to some embodiments, the electronic device may include a part of a furniture or building/structure, an electronic board, an electronic signature receiving device, a projector, and various measuring instruments (e.g., a water, electricity, gas, electric wave measuring device, etc.). The electronic device according to various embodiments of the disclosure may be one of the above-listed devices or a combination thereof. The electronic device according to some embodiments may be a flexible electronic device. The electronic device according to various embodiments of the disclosure is not limited to the above-listed devices and may include new electronic devices according to technical development.

Hereinafter, an electronic device according to various embodiments of the disclosure will be described with reference to the accompanying drawings. Herein, the term "user" used in various embodiments of the disclosure may refer to a person who uses the electronic device or a device using the electronic device.

Figure 1B:
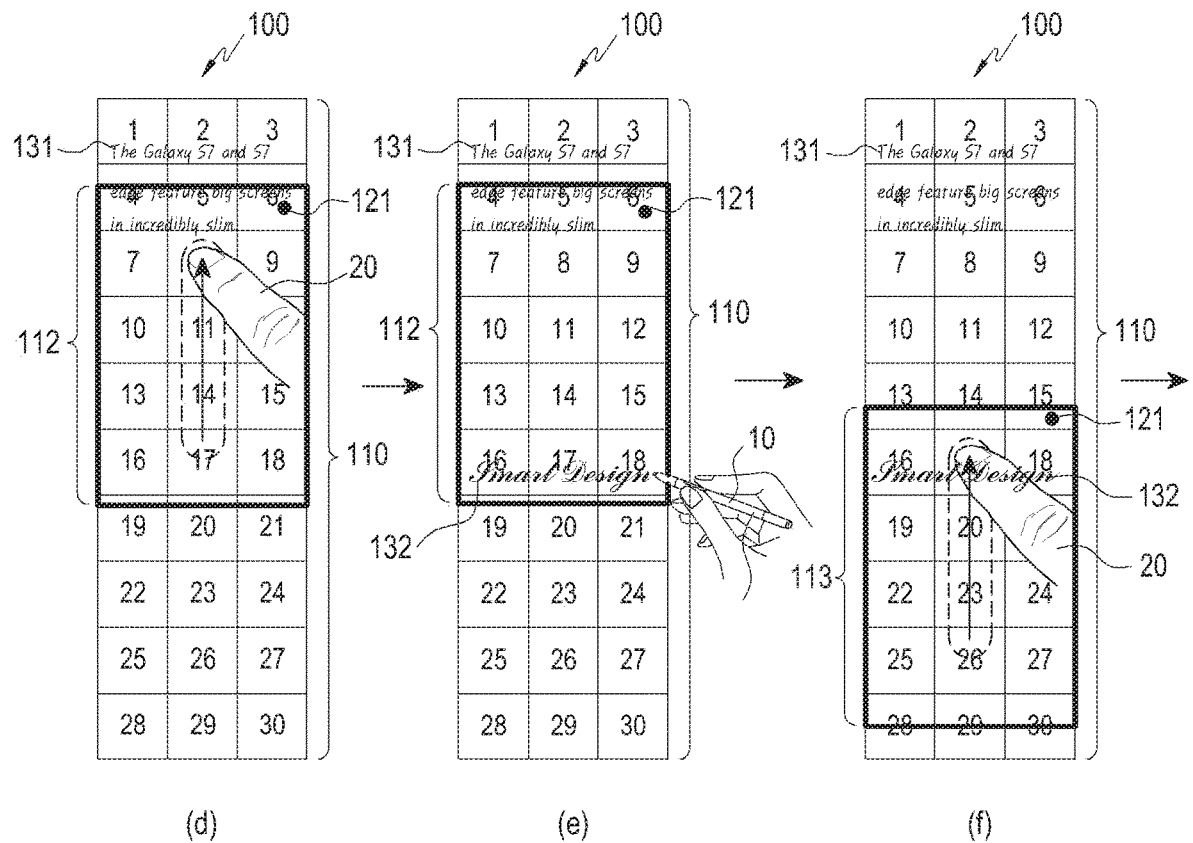
Figure 1C:
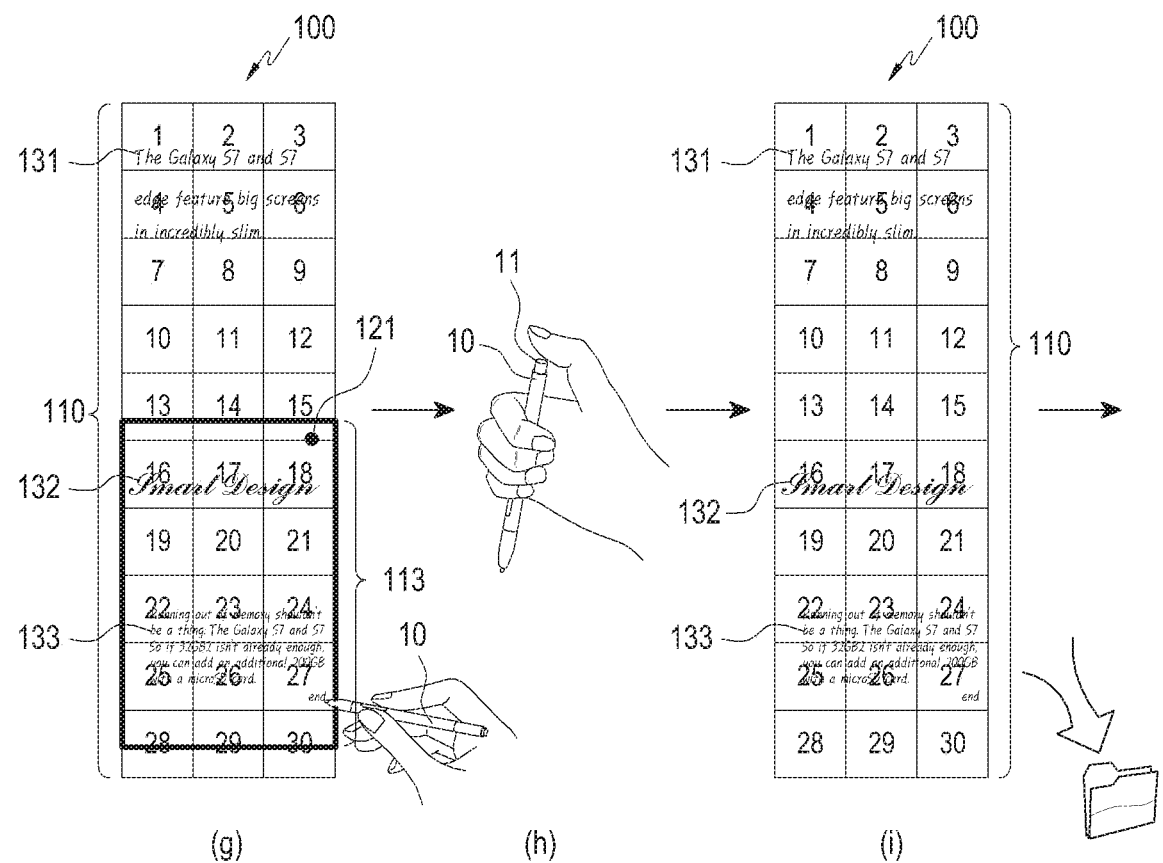

FIGS. 1A to 1C show screens for storing user data according to various embodiments of the disclosure.

Referring to (a) of FIG. 1A, an electronic device 100 may display first screen data 111 in a display region.

The first screen data 111 may be screen data that is currently displayed in a display region within a view port of the electronic device 100, as a part of the entire screen data 110.

When screen data is currently displayed, a user may press a member 11 included in an electronic pen 10, as illustrated in (b) of FIG. 1A. User manipulation to press the member 11 may have the metaphorical effect of, for example, pressing a button protrudingly provided in a side of a ballpoint pen that makes the tip of the pen protrude out, and may be user manipulation to press the member 11 that protrudes from the side of the electronic pen 10 and that is insertable into the electronic pen 10 by user manipulation. Thus, the electronic device 100 may receive a first event signal from the electronic pen 10. That is, the first event signal may be generated by user manipulation to press the member 11 included in the electronic pen 10.

Based on the received first event signal, the electronic device 100 may operate in a first mode for generating user data corresponding to a pen input using the electronic pen 10. The first mode may be referred to as, for example, a clipping mode, meaning user data extraction, a handwriting mode, or a writing mode. In this case, the electronic device 100 may display in a display region, with an indicator 121 indicating that the electronic device 100 is operating in the first mode.

As illustrated in (c) of FIG. 1A, while the electronic device 100 operates in the first mode, the user may perform a first pen input against a display region where the first screen data 111 is displayed, by using the electronic pen 10.

A pen input may include, for example, at least one of user input such as writing or drawing. Upon sensing the first pen input, the electronic device 100 may generate first user data 131 corresponding to the sensed first pen input.

For example, the electronic device 100 may receive coordinate values of touched points corresponding to the first pen input, store the coordinate values of the touched points as strokes, and generate a stroke array by using the stored strokes. The electronic device 100 may recognize writing corresponding to the sensed first pen input by using a generated stroke array list.

In this case, the generation of user data may mean, for example, generating data stored in a stroke array, recognized writing-aware data, or processed data obtained by processing recognition data.

Generation of user data may also include displaying user data together with screen data that is currently displayed during a pen input operation. In this case, the user data may be continuously displayed together with the screen data for a predetermined time (e.g., three seconds or longer), for longer than the predetermined time, or until occurrence of an event. For example, the user data may be displayed together with the screen data until at least a part of the screen data on display switches into another screen data. The user data may also be displayed together with the screen data until the user arbitrarily deletes the user data.

Next, as illustrated in (d) of FIG. 1B, the electronic device 100 may display second screen data 112 in place of first screen data 111 in the display region based on a user input against the display region. The first screen data 111 and the second screen data 112 may be screen data associated with each other. For example, the second screen data 112 may be, for example, a part of the entire screen data 110 (e.g., a web page screen), and may be screen data that continues from the first screen data 111. In this case, a part of the second screen data 112 may overlap a part of the first screen data 111.

In this case, the user input against the display region may be a user input to scroll on the display region to display the second screen data 112 instead of the first screen data 111 on display in the display region. The user input to scroll may be a touch drag input or a flick input in a direction with respect to the display region that uses a user's finger 20 or the electronic pen 10.

During display of the second screen data 112, as illustrated in (e) of FIG. 1B, the user may perform a second pen input using the electronic pen 10 against the display region where the second screen data 112 is displayed. Upon sensing the second pen input, the electronic device 100 may display second user data 132 corresponding to the sensed second pen input.

Next, as illustrated in (f) of FIG. 1B, the electronic device 100 may display third screen data 113 in place of second screen data 112 on display in the display region, based on a user input using a finger 20 against the display region. The third screen data 113 may be, for example, a part of the entire screen data 110 and may be screen data that continues from the second screen data 112. In this case, a part of the third screen data 113 may overlap a part of the second screen data 112.

During display of the third screen data 113, as illustrated in (g) of FIG. 1C, the user may perform a third pen input using the electronic pen 10 against the display region where the third screen data 113 is displayed. Upon sensing the third pen input, the electronic device 100 may display third user data 133 corresponding to the sensed third pen input.

In (h) of FIG. 1C, the user may press the member 11 included in the electronic pen 10 again or may cause the member 11 pressed by the user manipulation in (h) of FIG. 1A to protrude. Thus, the electronic device 100 may receive a second event signal corresponding to the first event signal from the electronic pen 10.

Based on the received second event signal, the electronic device 100 may be released from the first mode and operate in a second mode. The second mode may be, for example, a mode where user data corresponding to a pen input is not generated.

The second mode may be referred to as, for example, a clipping release mode, a handwriting release mode, a writing release mode, or a normal mode. In this case, the electronic device 100 may delete the indicator on display in the display region to indicate that the electronic device 100 has been released from the first mode.

Once operating in the second mode, as illustrated in (i) of FIG. 1C, the electronic device 100 may associate the first through third user data 131, 132, and 133 generated in the first mode with one another and store the first through third user data 131, 132, and 133. In this case, the electronic device 100 may store the entire screen data 110 including the first through third screen data 111, 112, and 113 overlappingly with the first through third user data 131, 1.32, and 133 as one file.

The file may be an image file or a text file in which the first through third user data 131, 132, and 133 are writing-recognized. The file may also be a file generated in a markup language, which includes a link of each of the first through third user data 131, 132, and 133.

According to various embodiments, when each of the first through third user data 131, 132, and 133 is generated as a separate layer, layers including the first through third user data 131, 132, and 133 may be combined with a layer of the entire screen data 1110 such that the entire screen data 110 may overlap the first through third user data 131, 132, and 133.

According to another embodiment, the user data and the screen data may be generated as one layer. For example, when the user data is generated, the user data and the screen data may be captured and generated as one layer. When a plurality of captured layers are generated, the electronic device 100 may remove the overlapping parts of screen data and combine the layers to provide the entire screen data 110 overlappingly with the first through third user data 131, 132, and 133.

(i) of FIG. 1C may show a form of data provided to the user when a stored file is executed. In this case, the entire data provided may be displayed within the view port, or a part of the data may be displayed within the view port and another part of the data may be displayed in the display region according to the user's scroll input.

Figure 2:
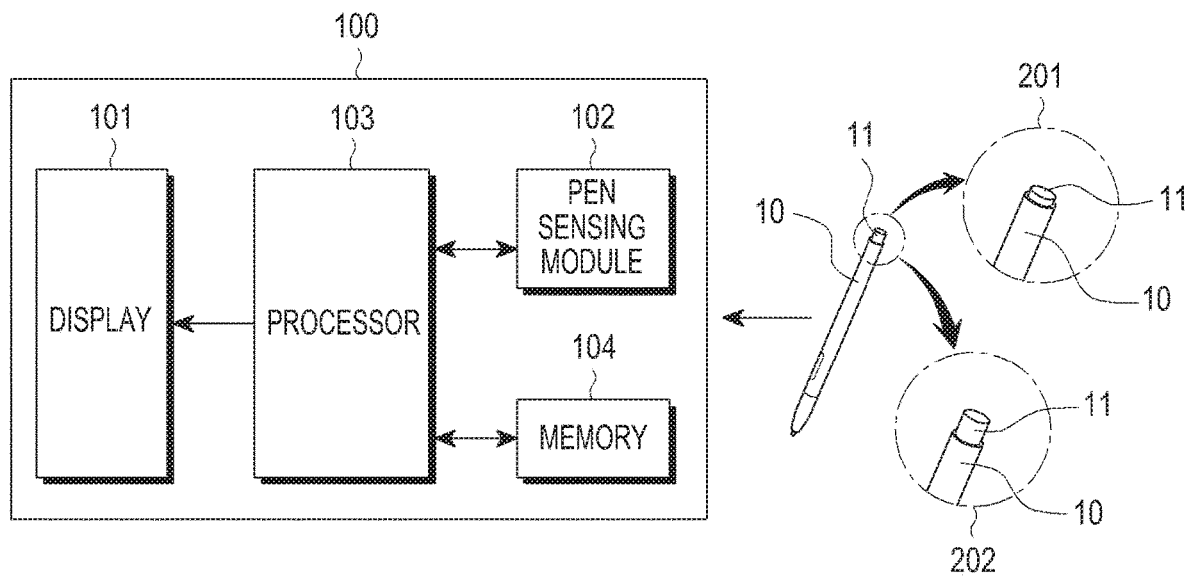
FIG. 2 is a block diagram of an electronic device and an electronic pen according to various embodiments of the disclosure.

FIG. 2 is a block diagram of the electronic device 100 and the electronic pen 10 according to various embodiments of the disclosure.

Referring to FIG. 2, the vehicle device 100 may include a display 101, a pen sensing module 102, a processor 103, and a memory 104. Components illustrated in FIG. 2 are examples for implementing embodiments of the disclosure, and proper hardware/software configurations that are obvious to those of ordinary skill in the art may be added to the electronic device 100.

The electronic pen 10 may include a stylus, a touch pen, a capacitive electronic pen, a resistive electric pen, or the like. The electronic pen 10 may be provided inside the electronic pen 100 detachably from the electronic pen 100, or may be an accessory device purchased separately from the electronic device 100. The user may perform a pen input against a display region by using the electronic pen 10. The pen input against the display region may include, for example, a memo input or a handwriting input by locating the electronic pen 10 on the display region that touches or proximately touches the display region. The pen input against the display region may also include a pen input by locating the electronic pen 10 on a cover window or a cover film that touches or proximately touches the cover window or the cover film.

The electronic pen 10 may include a member the user may press, as described above with reference to FIG. 1. When the user presses the member, the electronic pen 10 may send an event signal to the electronic device 100.

For example, when the member 11 of the electronic pen 10 is pressed as indicated by 201 of FIG. 2, the electronic pen 10 may send the first event signal to the electronic device 100. In this case, when the member is continuously in a pressed state, the electronic pen 10 may periodically send the first event signal to the electronic device 100.

When the member 11 of the electronic pen 10 protrudes as indicated by 202 of FIG. 2, the electronic pen 10 may send the second event signal to the electronic device 100. In this case, when the member is continuously in a protruding state, the electronic pen 10 may periodically send the second event signal to the electronic device 100.

The display 101 may provide the display region where visual information is displayed. The display 101 may include the entire display 1360 illustrated in FIG. 13 or a part thereof. The display 101 may also include the entire display 1460 illustrated in FIG. 14 or a part thereof.

The pen sensing module 102 may sense a pen input that uses the electronic pen 10. The pen sensing module 102 may include the entire pen sensor 1454 illustrated in FIG. 14 or a part thereof. The pen sensing module 102 may be implemented as one module with the display 101 by being stacked with the display 101.

The pen sensing module 102 may sense a pen input based on a change in the strength of an electromagnetic field through the proximity or touch of the electronic pen 10 with respect to the display 101. When the electronic pen 10 provides an optical input, the pen sensing module 102 may sense a pen input corresponding to optical recognition. The pen sensing module 102 may send data regarding the sensed input to the processor 103.

An event receiving module (not shown) may receive an event signal from the electronic pen 10 in correspondence with user manipulation to press the member included in the electronic pen 10. The event receiving module may be a part of the pen sensing module 102 or a part of a communication unit (not shown), or may be included in the electronic device 100 as a separate module. When the event receiving module is a part of the communication unit, the communication unit may include the entire communication interface 1370 of FIG. 13, which is to be described later, or a part thereof. The communication unit may also include the entire communication module 1420 illustrated in FIG. 14 or a part thereof. The event receiving module may send data corresponding to the received event signal to the processor 103.

The processor 103 may operate in the first mode or the second mode based on the event signal received from the electronic pen 10, as described above with reference to FIG. 1.

For example, upon receiving the first event signal generated by user manipulation to press the member included in the electronic pen 10, the processor 103 may operate in the first mode and may display, in the display region, user data corresponding to a pen input sensed during an operation in the first mode.

Upon receiving the second event signal generated by user manipulation to press the member included in the electronic pen 10, the processor 103 may operate in the second mode and may display, in the display region, user data corresponding to a pen input sensed during an operation in the second mode.

The processor 103 may be electrically connected with the display 101 and the pen sensing module 102 and control overall operations and functions of the electronic device 100. The processor 103 may include the entire processor 1320 illustrated in FIG. 13 or a part thereof. The processor 103 may include the entire processor 1410 illustrated in FIG. 14 or a part thereof.

The processor 103 may load a command stored in the memory 104 and, according to an operation based on the loaded command, generate first user data corresponding to a first pen input when the pen sensing module 102 senses the first pen input using the electronic pen 10 against the display region where first screen data is displayed, while operating in the first mode based on the first event signal received from the electronic pen 10. Next, the processor 103 may display the second screen data in the display region based on the user input against the display region. The processor 103 may generate second user data corresponding to a second pen input when the pen sensing module 102 senses the second pen input using the electronic pen 10 against the display region where the second screen data is displayed. The processor 103 may store the first user data associatively with the second user data while operating in the second mode based on the second event signal corresponding to the first event signal received from the electronic pen 10.

The memory 104 may be electrically connected with the processor 103 and store instructions or data associated with at least one other element of the electronic device 100. The memory 104 may include the entire memory 1330 illustrated in FIG. 13 or a part thereof. The memory 104 may include the entire memory 1430 illustrated in FIG. 14 or a part thereof.

The memory 104 may store instructions for causing the processor 103 to generate the first user data corresponding to the first pen input when the pen sensing module 102 senses the first pen input using the electronic pen 10 against the display region where the first screen data is displayed, while operating in the first mode based on the first event signal received from the electronic pen 10, to display the second screen data in the display region based on the user input against the display region, to generate the second user data corresponding to the second pen input when the pen sensing module 102 senses the second pen input using the electronic pen 10 against the display region where the second screen data is displayed, and to store the first user data associatively with the second user data in the memory 104 while operating in the second mode based on the second event signal corresponding to the first event signal received from the electronic pen 10.

According to various embodiments, the memory 104 may store instructions for causing the processor 103 to store entire screen data including the first user data and the second user data overlappingly with the first user data and the second user data when storing the first user data associatively with the second user data.

According to various embodiments, the memory 104 may store instructions for causing the processor 130 to store the first user data associatively with the second user data in a hierarchical structure when storing the first user data associative he second user data.

When the electronic device 100 further includes a touch sensing module (not shown), the memory 104 may store instructions for causing the processor 103 to display the second screen data in the display region based on a sensed user input when the touch sensing module senses the user input against the display region. The touch sensing module may also include the entire touch panel 1452 illustrated in FIG. 14 or a part thereof.

Figure 3:
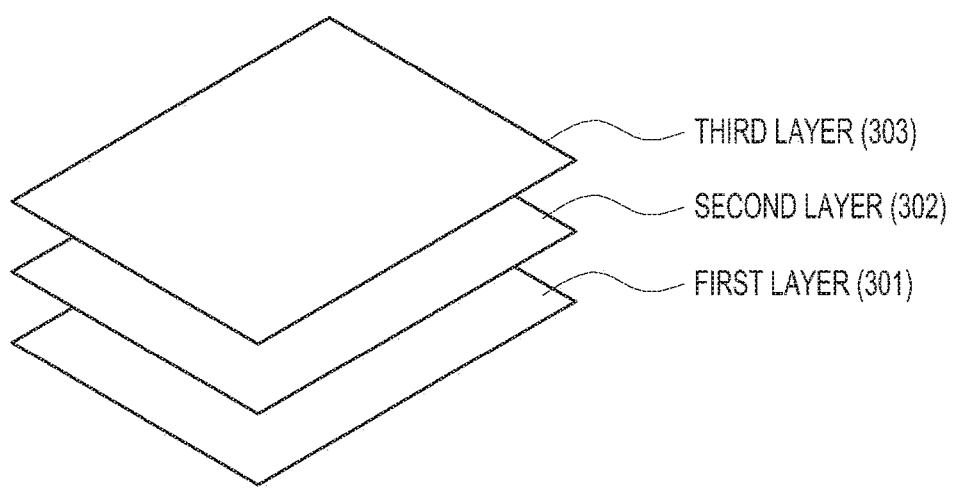
FIG. 3 illustrates layers provided by a display according to various embodiments of the disclosure.

FIG. 3 illustrates layers provided by the display 101 according to an embodiment of the disclosure.

Referring to FIG. 3, the display 101 of the electronic device 100 may include a first layer 301 where screen data is provided, a second layer 302 where a finger input is sensed, and a third layer 303 where user data is provided. In this case, the respective layers 301, 302, and 303 may be logical layers implemented with software, physical layers separated by hardware, or a combination thereof.

The first layer 301 may be a region providing screen data. The screen data may include at least one content from among video, audio, text, and graphics, location information about a location where the at least one content is stored, or information about a configuration of the at least one content. The screen data may be, for example, data constituting a web screen (or a web page), an application execution screen, a content execution screen, or a home screen. The screen data may also include screen data that has attributes which are changed after capturing of the screen data.

The third layer 303 may be a region where a pen input is sensed and user data corresponding to the sensed pen input is provided. The user data may be, for example, data associated with at least one of writing, drawing, text typing, underlining, and marking displayed in the display region in correspondence with the pen input.

The third layer 303 may operate as an active region or an inactive region. For example, as stated above, while the electronic device 100 operates in the first mode based on the first event signal received from the electronic pen 10, the third layer 303 may operate as an active region; while the electronic device 100 operates in the second mode based on the second event signal received from the electronic pen 10, the third layer 303 may operate as an inactive region.

The second layer 302 may be a region where a user's finger input is sensed. In this case, according to a finger input sensed in the second layer 302, the screen data provided in the first layer 301 and the user data provided in the third layer 303 may be selectively controlled in the first mode or the second mode.

For example, when the user zooms in or out with a finger in the second layer 302, the electronic device 100 may enlarge or shrink the screen data currently provided in the first layer 301 and the user data currently provided in the third layer 303 at the same time. When the user zooms in or out with a finger in the second layer 302, the electronic device 100 may enlarge or shrink one of the screen data currently provided in the first layer 301 and the user data currently provided in the third layer 303.

FIGS. 4A through 6D illustrate user data for multiple screen data according to various embodiments of the disclosure.

Figure 4A:
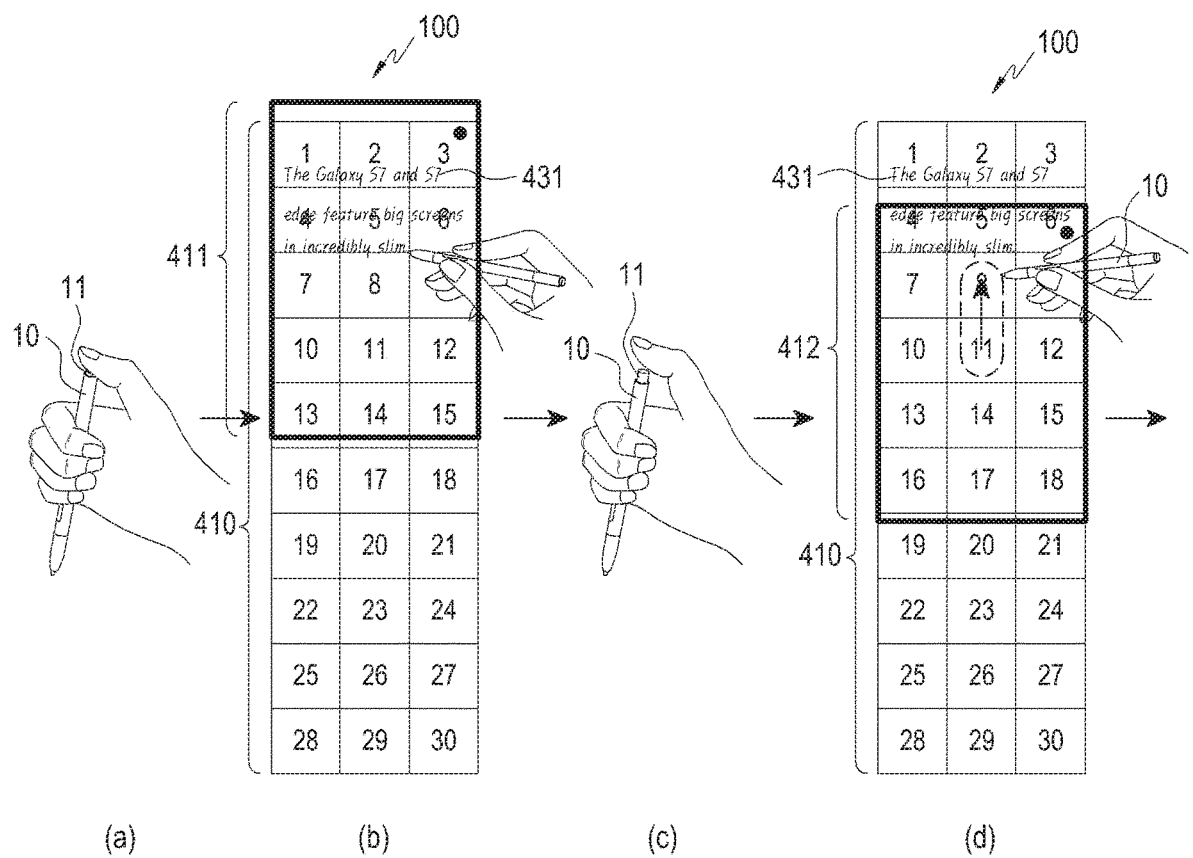
FIGS. 4A through 7 illustrate user data for plural screen data according to various embodiments of the disclosure.
Figure 4B:
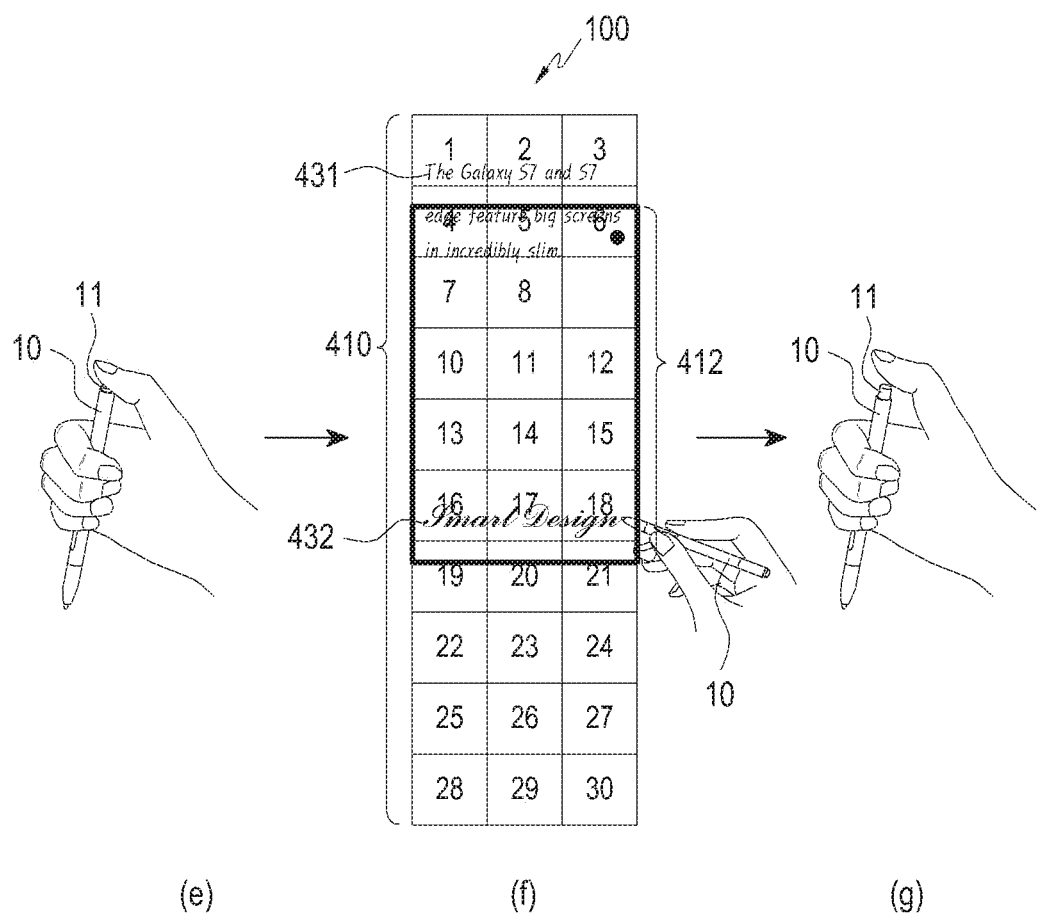

According to an embodiment, referring to FIGS. 4A and 4B, when multiple screen data 411 and 412 are a part of the entire screen data 410, the user may switch between the multiple screen data 411 and 412 by scrolling all of the screen data 410. In this case, by using the electronic pen 10, the user may repeatedly execute the first mode, in which user data is generated, and the second mode, in which no user data is generated, and perform a pen input with respect to the multiple screen data 411 and 412. This situation may be, for example, one where the user writes on a web page while scrolling the web page.

Specifically, as illustrated in (a) of FIG. 4A, the user may press the member 11 included in the electronic pen 10. Thus, based on the first event signal received from the electronic pen 10, the electronic device 100 may operate in the first mode for generating user data corresponding to a pen input using the electronic pen 10.

As illustrated in (b) of FIG. 4A, when the electronic device 100 operates in the first mode, the user may perform a first pen input against a display region where first screen data 411 is displayed, by using the electronic pen 10. Thus, the electronic device 100 may display first user data 431 corresponding to the sensed first pen input in the display region.

As illustrated in (c) of FIG. 4A, the user having performed the first pen input may press the member 11 included in the electronic pen 10 again. Thus, the pressed member 11 may protrude. In this case, based on the second event signal received from the electronic pen 10, the electronic device 100 may operate in the second mode where no user data is displayed in the display region even if a user input using the electronic pen 10 is performed.

Next, as illustrated in (d) of FIG. 4A, the electronic device 100 may display second screen data 412 in place of the first screen data 411 in the display region based on a user input against the display region. The user input against the display region may be a user input to scroll the entire screen data 410 by using the electronic pen 10 while the electronic device 100 operates in the second mode.

As illustrated in (e) of FIG. 4B, the user having switched the screen data may press the member 11 included in the electronic pen 10 again. Thus, based on the first event signal received from the electronic pen 10, the electronic device 100 may operate in the first mode for generating user data corresponding to a pen input using the electronic pen 10.

As illustrated in (f) of FIG. 4B, when the electronic device 100 operates in the first mode, the user may perform a second pen input against the display region where second screen data 412 is displayed, by using the electronic pen 10. Thus, the electronic device 100 may display second user data 432 corresponding to the sensed second pen input in the display region.

Specifically, as illustrated in (g) of FIG. 4B, the user may press the member 11 included in the electronic pen 10 again. Based on the received second event signal, the electronic device 100 may be released from the first mode and operate in the second mode.

Figure 5:
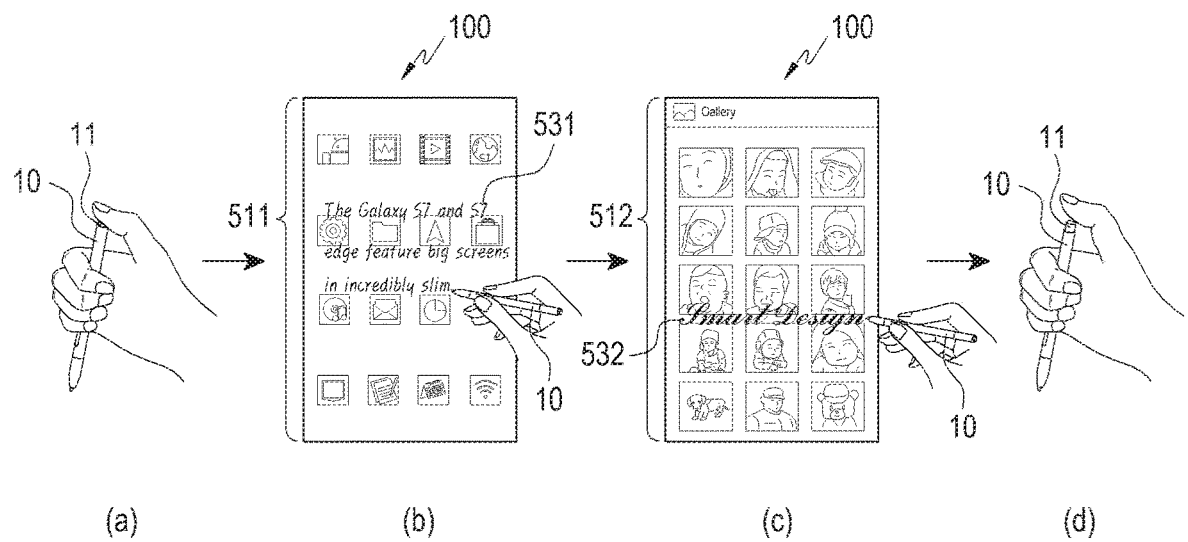

In another embodiment, referring to FIG. 5, among multiple screen data, the first screen data may be an execution screen 511 of a first application and the second screen data may be an execution screen 512 of a second application. In this case, the user may perform a pen input with respect to multiple screen data by using the electronic pen 10.

Specifically, as illustrated in (a) of FIG. 5, the user may press the member 11 included in the electronic pen 10. Thus, based on the first event signal received from the electronic pen 10, the electronic device 100 may operate in the first mode for generating user data corresponding to a pen input using the electronic pen 10.

As illustrated in (b) of FIG. 5, when the electronic device 100 operates in the first mode, the user may perform a first pen input against a display region where an execution screen 511 of the first application is displayed, by using the electronic pen 10. Thus, the electronic device 100 may display first user data 531 corresponding to the sensed first pen input in the display region.

Next, the user may execute a second application. For example, the user may execute the second application by selecting a shortcut icon of the second application on the home screen. Alternatively, when the second application operates in the background, the user may select identification information of the second application from a menu for providing applications in the background and execute the second application.

As illustrated in (c) of FIG. 5, the user may perform a second pen input using the electronic pen 10 against the display region where an execution screen 512 of the second application is displayed. Upon sensing the second pen input, the electronic device 100 may display second user data 532 corresponding to the sensed second pen input.

Next, as illustrated in (d) of FIG. 5, the user may press the member 11 included in the electronic pen 10 again. Based on the received second event signal, the electronic device 100 may be released from the first mode and operate in the second mode.

Figure 6:
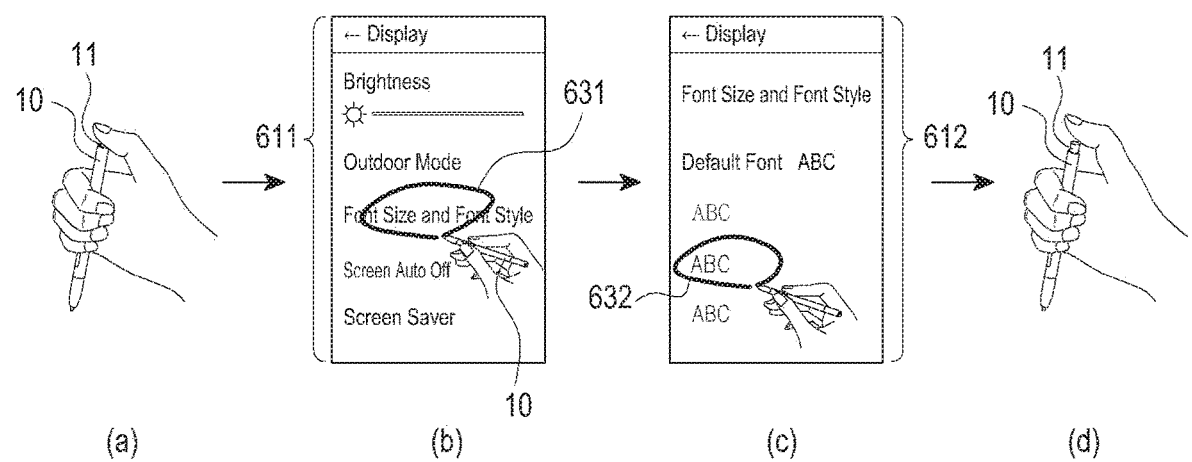

In another embodiment, referring to FIG. 6, among the multiple screen data, the first screen data may be a screen (e.g., a function setting screen or a main web page screen) 611 of an application, and the second screen data may be a sub screen (e.g., a function detail setting screen or a linked web page screen) 612 of the screen 611. In this case, the user may perform a pen input with respect to multiple screen data by using the electronic pen 10.

Specifically, as illustrated in (a) of FIG. 6, the user may press the member 11 included in the electronic pen 10. Thus, based on the first event signal received from the electronic pen 10, the electronic device 100 may operate in the first mode for generating user data corresponding to a pen input using the electronic pen 10.

As illustrated in (b) of FIG. 6, when the electronic device 100 operates in the first mode, the user may perform a first pen input against a display region where the screen 611 of the application is displayed, by using the electronic pen 10. The electronic device 100 may display user data (e.g., drawing data) 631 corresponding to the sensed first pen input in a region where one of a plurality of items included in the screen 611 is displayed, or near the region.

Next, the user may select one of the plurality of items on display in the display region. Thus, a sub screen 612 of an application associated with the selected item may be displayed in the display region.

As illustrated in (c) of FIG. 6, the user may perform a second pen input using the electronic pen 10 against the display region where the sub screen 612 of the application is displayed. Upon sensing the second pen input, the electronic device 100 may display second user data (e.g., drawing data) 632 corresponding to the sensed second pen input in a region where one of a plurality of sub items included in the sub screen 612 is displayed, or near the region.

Next, as illustrated in (d) of FIG. 6, the user may press the member 11 included in the electronic pen 10 again. Based on the received second event signal, the electronic device 100 may be released from the first mode and operate in the second mode.

Figure 7:
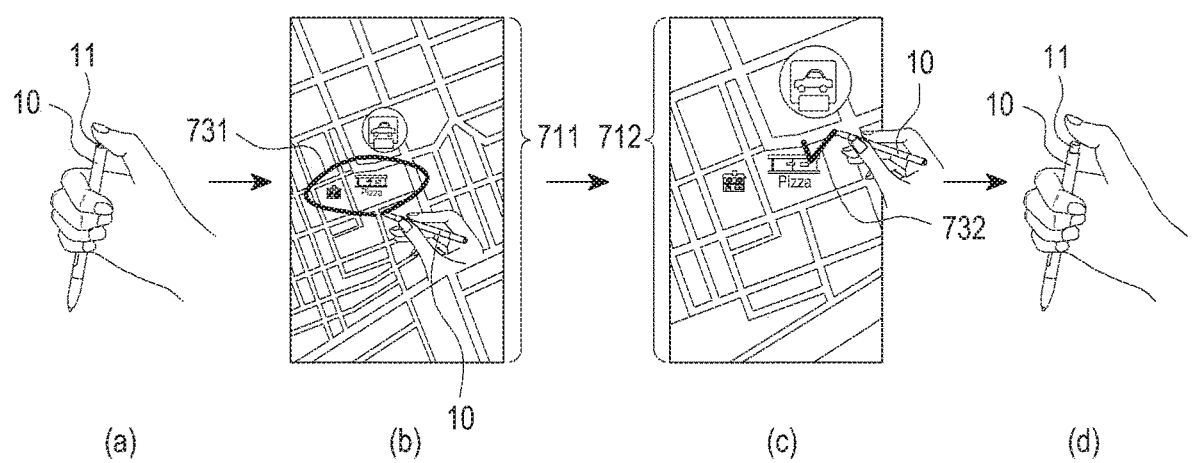

In another embodiment, referring to FIG. 7, among the multiple screen data, the first screen data may be a content display screen (e.g., a map content display screen or a thumbnail display screen) 711, and the second screen data may be an enlarged or shrunk screen (e.g., an enlarged/ shrunk map content screen or an enlarged/shrunk thumbnail screen) 712 of the content display screen 611. In this case, the user may perform a pen input with respect to multiple screen data by using the electronic pen 10.

Specifically, as illustrated in (a) of FIG. 7, the user may press the member 11 included in the electronic pen 10. Thus, based on the first event signal received from the electronic pen 10, the electronic device 100 may operate in the first mode for generating user data corresponding to a pen input using the electronic pen 10.

As illustrated in (b) of FIG. 7, while the electronic device 100 operates in the first mode, the user may perform a first pen input against a display region where a content screen 711 is displayed, by using the electronic pen 10. Thus, the electronic device 100 may display first user data (e.g., drawing data) 431 corresponding to the sensed first pen input.

Next, the user may enlarge content on display in the display region. For example, when the user does a zoom-in gesture against the display region, an enlarged content screen may be displayed in the display region.

As illustrated in (c) of FIG. 7, the user may perform a second pen input using the electronic pen 10 against the display region where an enlarged content screen 712 is displayed. Upon sensing the second pen input, the electronic device 100 may display second user data (e.g., marking data) 732 corresponding to the sensed second pen input.

Next, as illustrated in (d) of FIG. 7, the user may press the member 11 included in the electronic pen 10 again. Based on the received second event signal, the electronic device 100 may be released from the first mode and operate in the second mode.

Figure 8:
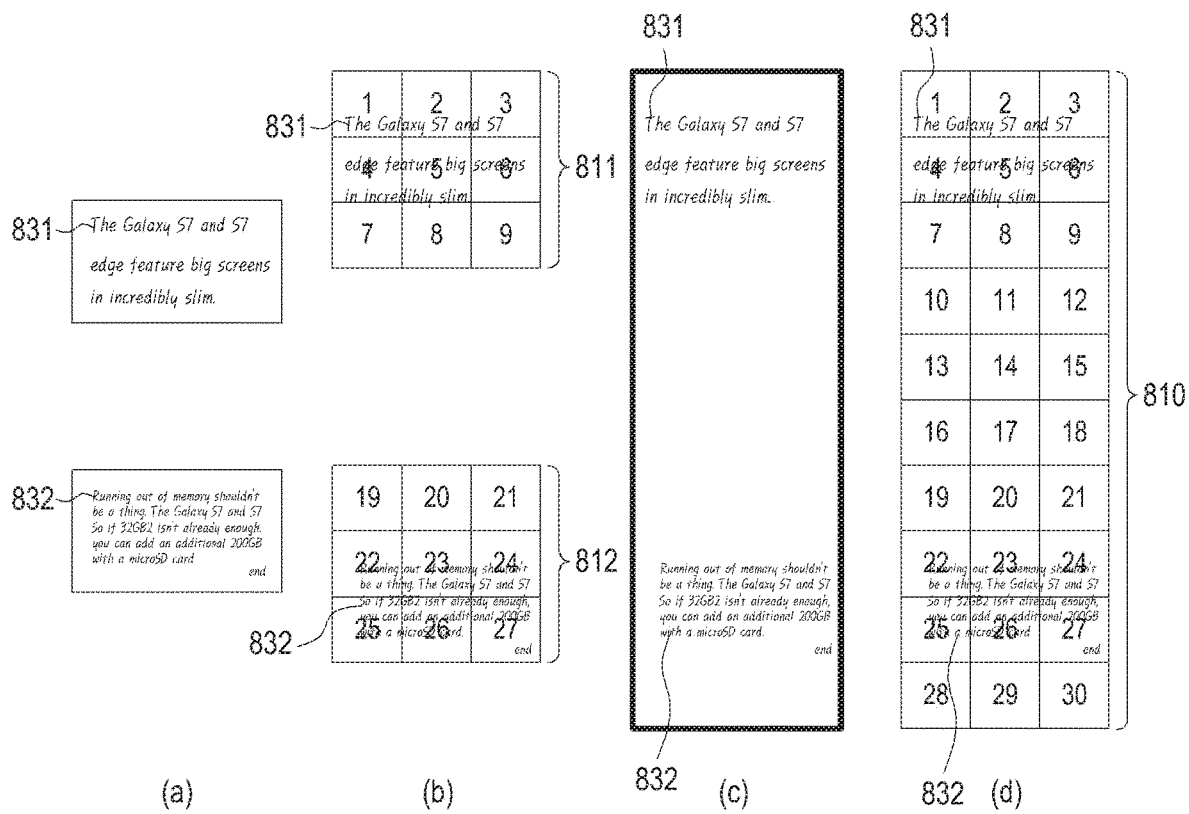
FIGS. 8 through 10 illustrate forms in which plural user data are stored, according to various embodiments of the disclosure.
Figure 9:
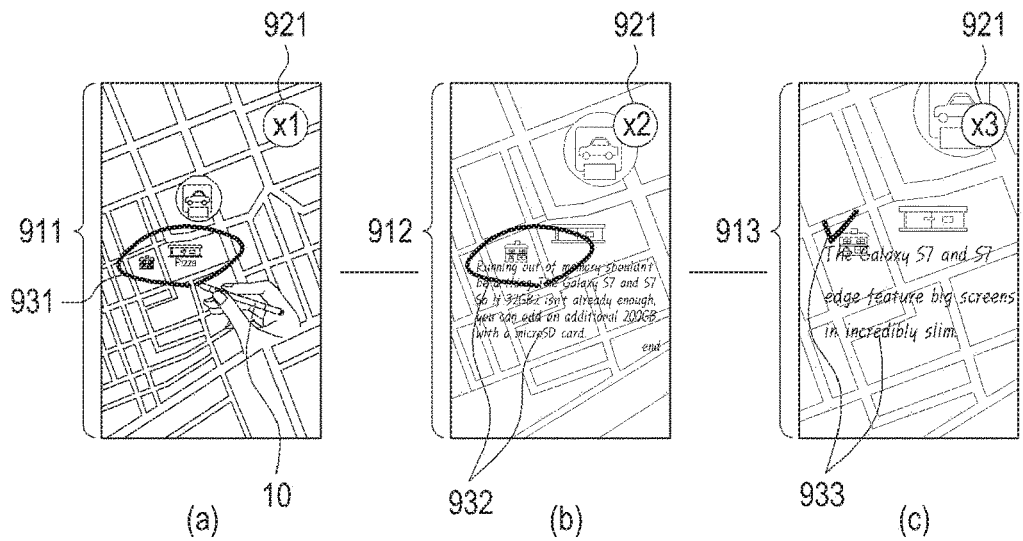
Figure 10:
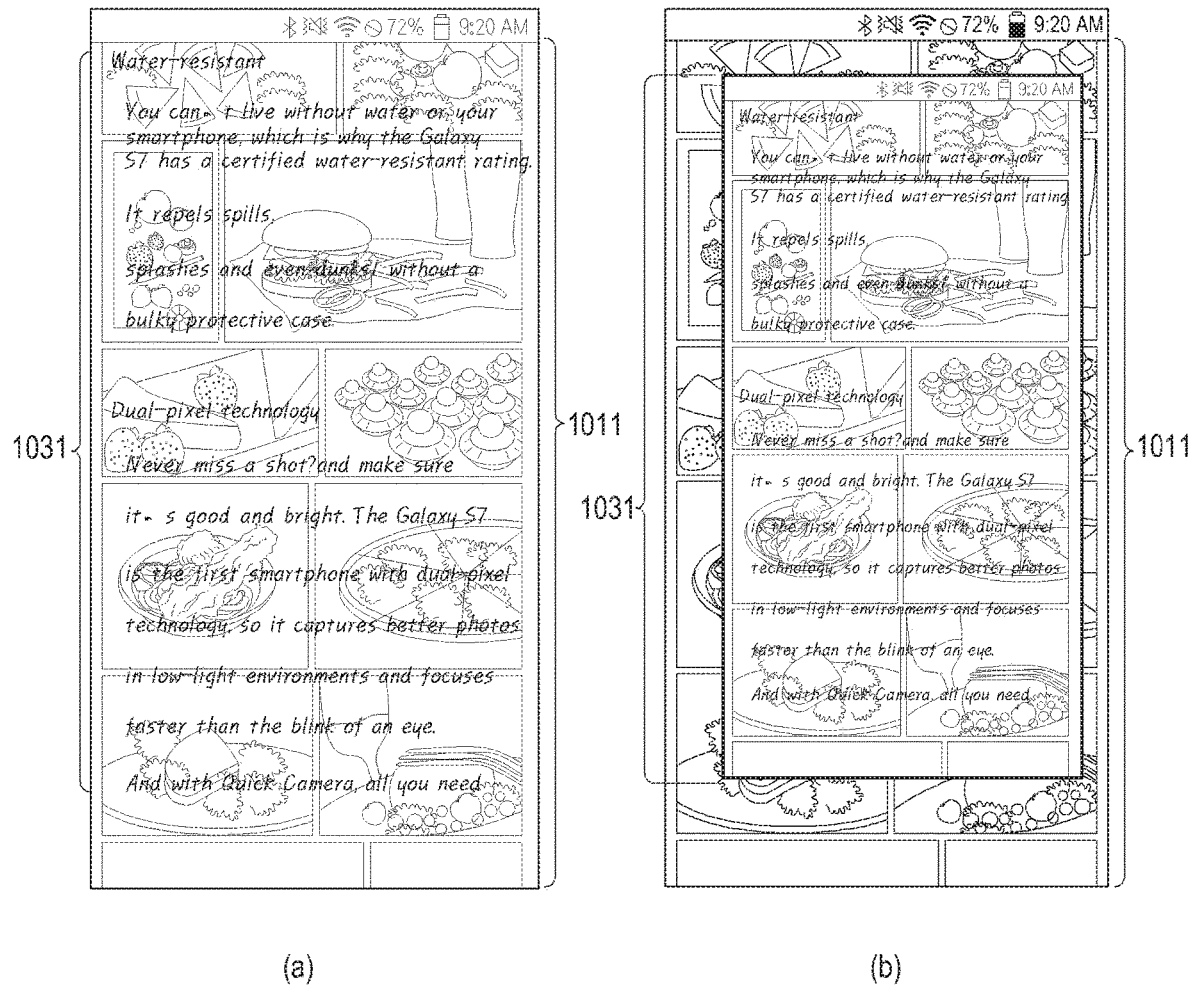

FIGS. 8 through 10 illustrate forms in which multiple user data are stored, according to various embodiments of the disclosure.

FIGS. 8 through 10 show a scheme to store user data generated by a pen input as described above. FIGS. 8 through 10 may also show a data format provided to a user when a stored file is executed.

For example, in FIG. 8, while the electronic device 100 operates in the first mode, first user data 831 and second user data 832, which correspond to user's pen inputs, may be generated for entire screen data. In this case, the user may press the member 11 included in the electronic pen 10. Based on a second event signal received from the electronic pen 10, the electronic device 100 may Operate in the second mode.

Once operating in the second mode, as illustrated in (a) of FIG. 8, the electronic device 100 may separately store the first user data 831 and the second user data 832. For example, the electronic device 100 may store the first user data 831 and the second user data 832 as separate files (e.g., image files, etc.).

Alternatively, as illustrated in (b) of FIG. 8, the electronic device 100 may store the first user data 831 overlappingly with first screen data 811, and may store the second user data 832 overlappingly with second screen data 812. For example, the electronic device 100 may store overlapping data as separate files (e.g., image files, etc.).

As illustrated in (c) of FIG. 8, the electronic device 100 may also store the first user data 831 associatively with the second user data 832. For example, the electronic device 100 may collectively store the first user data 831 and the second user data 832, which are inputted at different times for the entire screen data, as one image file.

In this case, the electronic device 100 may locate the first user data 831 and the second user data 832 such that in the entire screen data, the location where the first user data 831 is generated corresponds to the location where the second user data 832 is generated. Alternatively, the electronic device 100 may remove the empty space between the first user data 831 and the second user data 832 such that the first user data 831 and the second user data 832 are adjacent to each other.

As illustrated in (d) of FIG. 8, the electronic device 100 may store the first user data 831 and the second user data 832 overlappingly with entire screen data 810. A corresponding embodiment has already been described above with reference to (i) of FIG. 1C, and thus will not be described in detail at this time.

FIG. 9 illustrates forms in which multiple user data are stored, according to various embodiments of the disclosure.

FIG. 9 shows a scheme to store user data generated by a pen input against a content display screen, as described above. FIG. 9 may also show a data format provided to a user when a stored file is executed.

For example, in FIG. 8, when the electronic device 100 operates in the first mode, first user data 931, second user data 932, and third user data 933, which correspond to user's pen inputs, may be generated for entire screen data. In this case, the user may press the member 11 included in the electronic pen 10. Based on a second event signal received from the electronic pen 10, the electronic device 100 may operate in the second mode.

When the electronic device 100 operates in the second mode, the electronic device 100 may store enlarged content display screen 911 enlarged at a first magnification (×1) overlappingly with first user data 931 as illustrated in (a) of FIG. 9, may store enlarged content display screen 912 enlarged at a second magnification (×2) overlappingly with second user data 932 as illustrated in (b) of FIG. 9, and may store enlarged content display screen 913 enlarged at a third magnification (×n) overlappingly with third user data 933 as illustrated in (c) of FIG. 9.

In this case, the first through third user data 931, 932, and 933 may be associatively stored with one another in a hierarchical structure. The hierarchical structure may be, for example, a structure in which data is sequentially connected according to a predetermined criterion such as magnification, generation time, or data amount.

The user data connected in the hierarchical structure may be connected with each other and stored as one file, or may be stored as a manifest file or a markup language file that includes link information of the user data.

In this case, when the user executes a stored file, overlapping data may be sequentially displayed according to a user's input. For example, once the stored file is executed, as illustrated in (a) of FIG. 9, an image in which the content display screen 911, enlarged at the first magnification, and the first user data 931 overlap each other may be displayed in the display region. In this state, when the user does the zoom-in gesture, as illustrated in (b) of FIG. 9, an image in which the content display screen 912, enlarged at the second magnification, and the second user data 932 overlap each other may be displayed in the display region. In this state, when the user does the zoom-in gesture again, as illustrated in (c) of FIG. 9, an image in which the content display screen 913, enlarged at the third magnification, and the third user data 933 overlap each other may be displayed in the display region. On the other hand, when the user does a zoom-out gesture, in the order of (c), (b), then (a) of FIG. 9, the images in which the shrunk content display screens and the user data overlap each other are sequentially displayed in the display region.

An indicator 921 indicating the magnification of an image, together with an overlapping image, may be further displayed in the display region. The indicator 921 may include information about the magnification of a currently displayed image.

FIG. 10 illustrates forms in which multiple user data are stored, according to various embodiments of the disclosure.

In FIG. 10, when screen data. 1011 and user data 1031 are generated as separate layers, the electronic device 100 may convert at least one of the screen data 1011 and the user data 1031 and store the screen data 1011 overlappingly with the user data 1031.

For example, as illustrated in (a) of FIG. 10, the electronic device 100 may adjust the transparency of at least one of the screen data 1011 and the user data 1031 and store overlapping data. Upon receiving a second event signal for causing the electronic device 100 to operate in the second mode from the first mode, the electronic device 100 may provide a menu (not shown) for adjusting the transparency of at least one of the screen data 1011 and the user data 1031 before storing data where the screen data 1011 and the user data 1031 overlap each other.

In this case, when the user sets a low transparency for the screen data 1011 on the menu, as illustrated in (a) of FIG. 10, the electronic device 100 may store data where the screen data 1011 having low transparency and the user data 1031 overlap each other.

Meanwhile, the screen data 1011 and the user data 1031 may be stored as separate layers together. In this case, the user may execute a stored file, adjust the transparency of at least one layer of the screen data. 1011 and the user data 1031, and display overlapping data in the display region as illustrated in (a) of FIG. 10.

In another example, as illustrated in (b) of FIG. 10, the electronic device 100 may adjust the overlapping data by adjusting the magnification or the size of at least one of the screen data 1011 and the user data 1031. For example, upon receiving the second event signal for causing the electronic device 100 to operate in the second mode from the first mode, the electronic device 100 may provide a menu (not shown) for adjusting the magnification or the size of at least one of the screen data 1011 and the user data 1031.

In this case, when the user reduces the size of the user data on the menu, the electronic device 100 may store data where the screen data 1011 and the size-reduced user data 1031 overlap each other, as illustrated in (b) of FIG. 10.

Meanwhile, the screen data 1011 and the user data 1031 may be stored as separate layers together. In this case, the user may execute a stored file, adjust the size or magnification of at least one layer of the screen data 1011 and the user data 1031, and display overlapping data in the display region as illustrated in (b) of FIG. 10.

Figure 11:
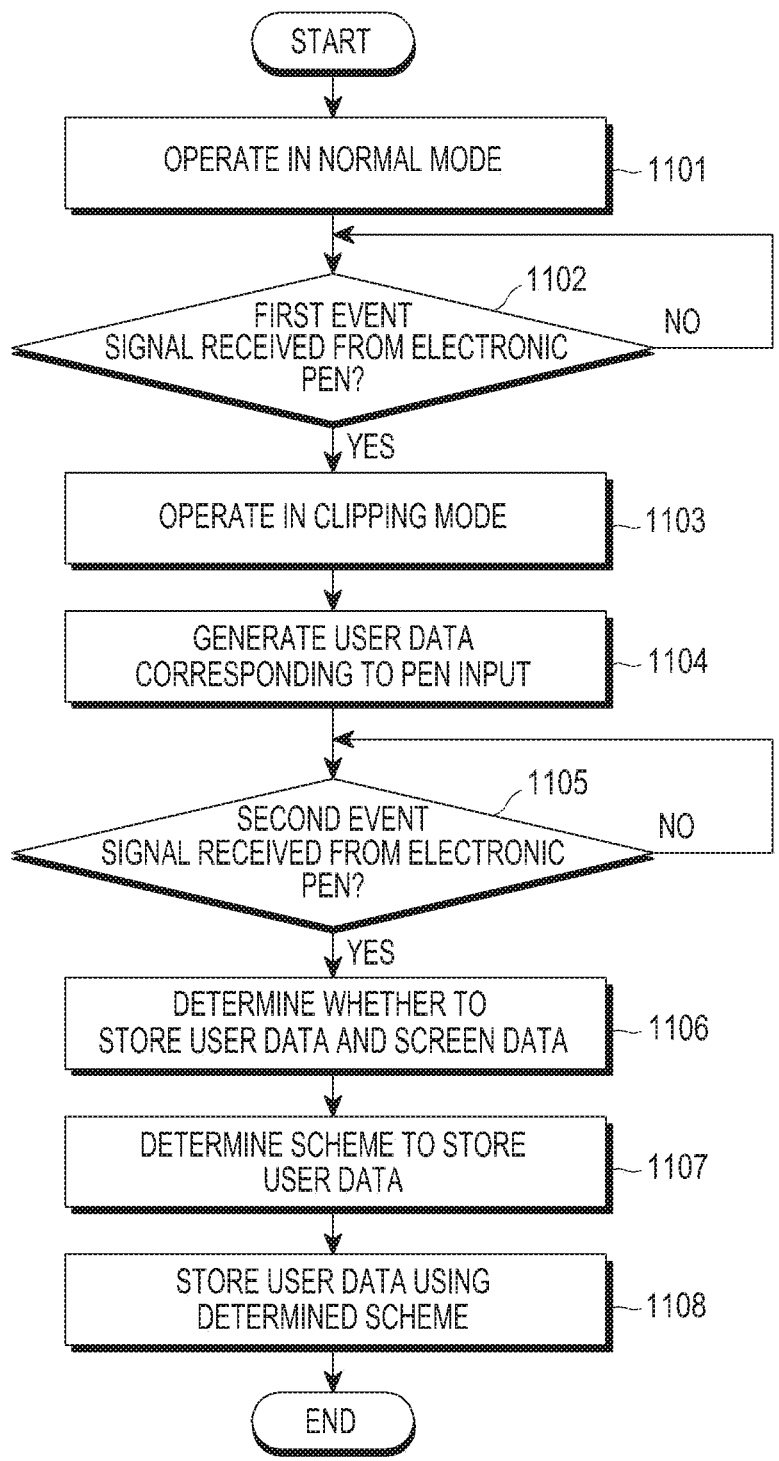
FIGS. 11 and 12 are flowcharts illustrating an operation of storing user data, according to various embodiments of the disclosure.

FIG. 11 is a flowchart illustrating an operation of storing user data according to an embodiment of the disclosure.

Referring to FIG. 11, in operation 1101, the electronic device 100 may operate in a normal mode. The normal mode may be the second mode in the foregoing embodiments where user data is not displayed in the display region in correspondence with a pen input. In the normal mode, when the user performs a pen input, the electronic device 100 may recognize a pen input as a user gesture to control screen data on display in the display region. For example, when the user performs a drag input using an electronic pen in the normal mode, the electronic device 100 may scroll screen data.

In operation 1102, the electronic device 100 may determine whether a first event signal is received from the electronic pen 10.

When determining that the first event signal is received, the electronic device 100 may operate in the clipping mode in operation 1103. The clipping mode may be the first mode in the foregoing embodiments where user data corresponding to a pen input is generated.

In the clipping mode, when the user performs a pen input using the electronic pen 10 against the display region where the screen data is displayed, the electronic device 100 may generate user data corresponding to the pen input in operation 1104. For example, the electronic device 100 may display the user data corresponding to the pen input in the display region.

In operation 1105, the electronic device 100 may determine whether a second event signal is received from the electronic pen 10.

When determining that the second event signal is received, the electronic device 100 may determine whether to store the user data and the screen data in operation 1106. For example, upon receiving the second event signal, the electronic device 100 may display, in the display region, a UI menu for asking whether to store the user data and the screen data together or to store only the user data. In this case, based on user's selection through the menu, the electronic device 100 may determine whether to store the user data and the screen data.

In operation 1107, the electronic device 100 may determine a scheme to store the user data. Operation 1106 may be performed before operation 1105. For example, when determining that the second event signal is received, the electronic device 100 may determine a scheme to store the user data.

To determine the scheme to store the user data, the electronic device 100 may display in the display region, a UI menu including a plurality of items representing schemes to store the user data. When the user selects one of the plurality of items, the electronic device 100 may determine a scheme corresponding to the selected item as the scheme to store the user data, and store the user data by using the determined scheme.

In an embodiment, as described with reference to (a) and (b) of FIG. 8, the electronic device 100 may separately store multiple user data generated while multiple screen data are displayed. Alternatively, as described with reference to (c) and (d) of FIG. 8, the electronic device 100 may associatively store multiple user data generated while multiple screen data are displayed. Alternatively, as described with reference to FIG. 9, the electronic device 100 may associatively store multiple user data such that the multiple user data are connected in a hierarchical structure.

Meanwhile, the user may select several items together from among a plurality of items representing schemes to store user data. In this case, the electronic device 100 may separately store each of the multiple user data and associatively store the multiple user data.

Figure 12:
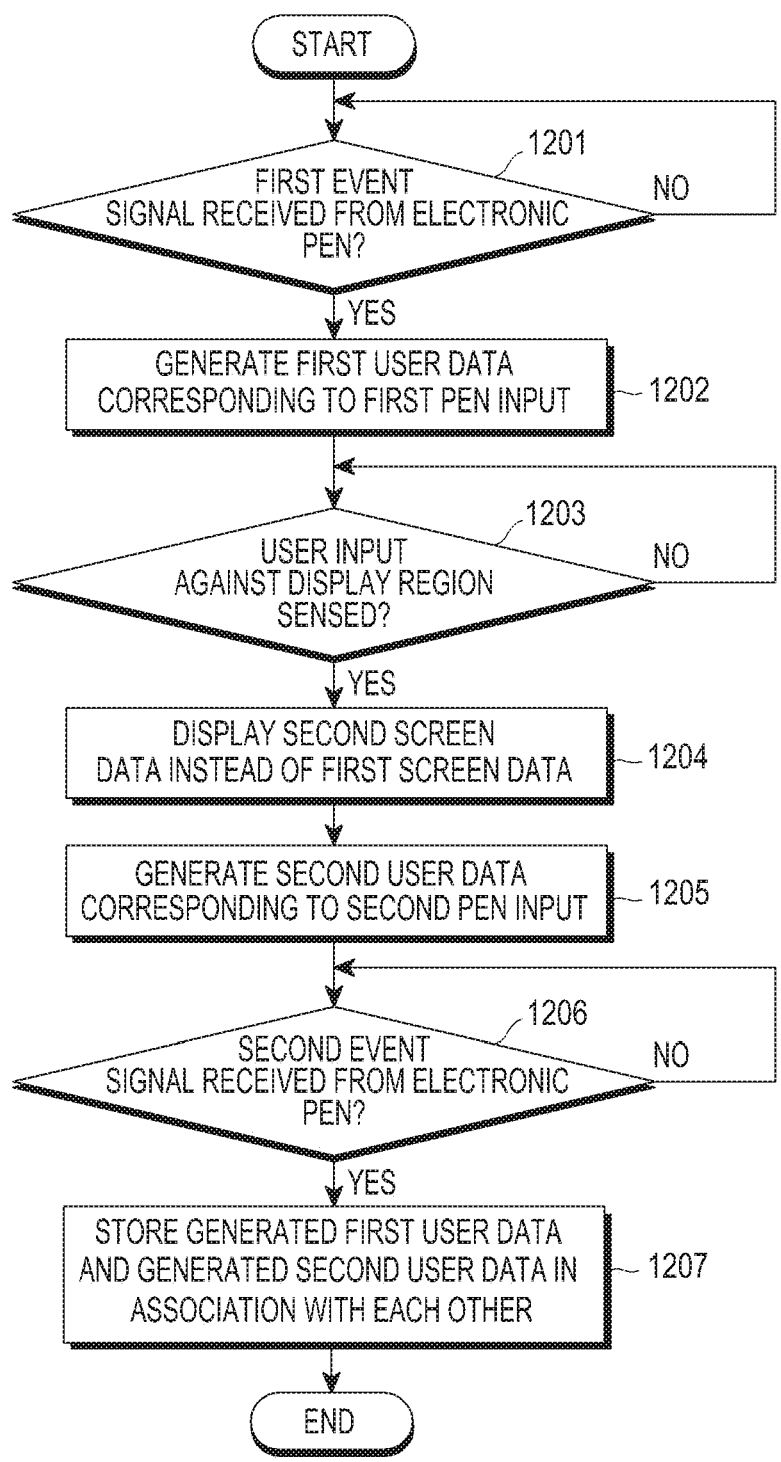

FIG. 12 is a flowchart illustrating an operation of storing user data according to an embodiment of the disclosure.

Referring to FIG. 12, in operation 1201, the electronic device 100 may determine whether a first event signal is received from the electronic pen 10.

When the first event signal is received and a first pen input using the electronic pen 10 is sensed while first screen data is displayed, the electronic device 100 may generate first user data corresponding to the first pen input in operation 1202. For example, the electronic device 100 may display first user data together with the first screen data in the display region.

In operation 1203, the electronic device 100 may determine whether a user input against the display region is sensed.

When the user input is sensed, the electronic device 100 may display second screen data instead of first screen data in the display region in operation 1201.

In this case, the first screen data and the second screen data may be screen data associated with each other.

For example, the first screen data may be a part of the entire screen data and the second screen data may be another part of the entire screen data. The first screen data may be data constituting a web page screen, and the second screen data may be data constituting another web page screen linked to the web page screen. The first screen data may be data constituting a content display screen, and the second screen data may be data constituting an enlarged or shrunk content display screen.

When the second input using the electronic pen 10 is sensed while the second screen data is displayed, the electronic device 100 may generate second user data corresponding to the second pen input in operation 1205. For example, the electronic device 100 may display the second user data together with the second screen data in the display region.

In operation 1206, the electronic device 100 may determine whether a second event signal is received from the electronic pen 10.

When determining that the second event signal is received, the electronic device 100 may store the first user data associatively with the second user data.

For example, the electronic device 100 may store the entire screen data including the first screen data and the second screen data overlappingly with the first user data and the second user data. Alternatively, the electronic device 100 may store the first user data associatively with the second user data in a hierarchical structure.

Hereinbelow, various features that are included in or may be included in the electronic device 100 will be described with reference to FIGS. 13 through 15.

Figure 13:
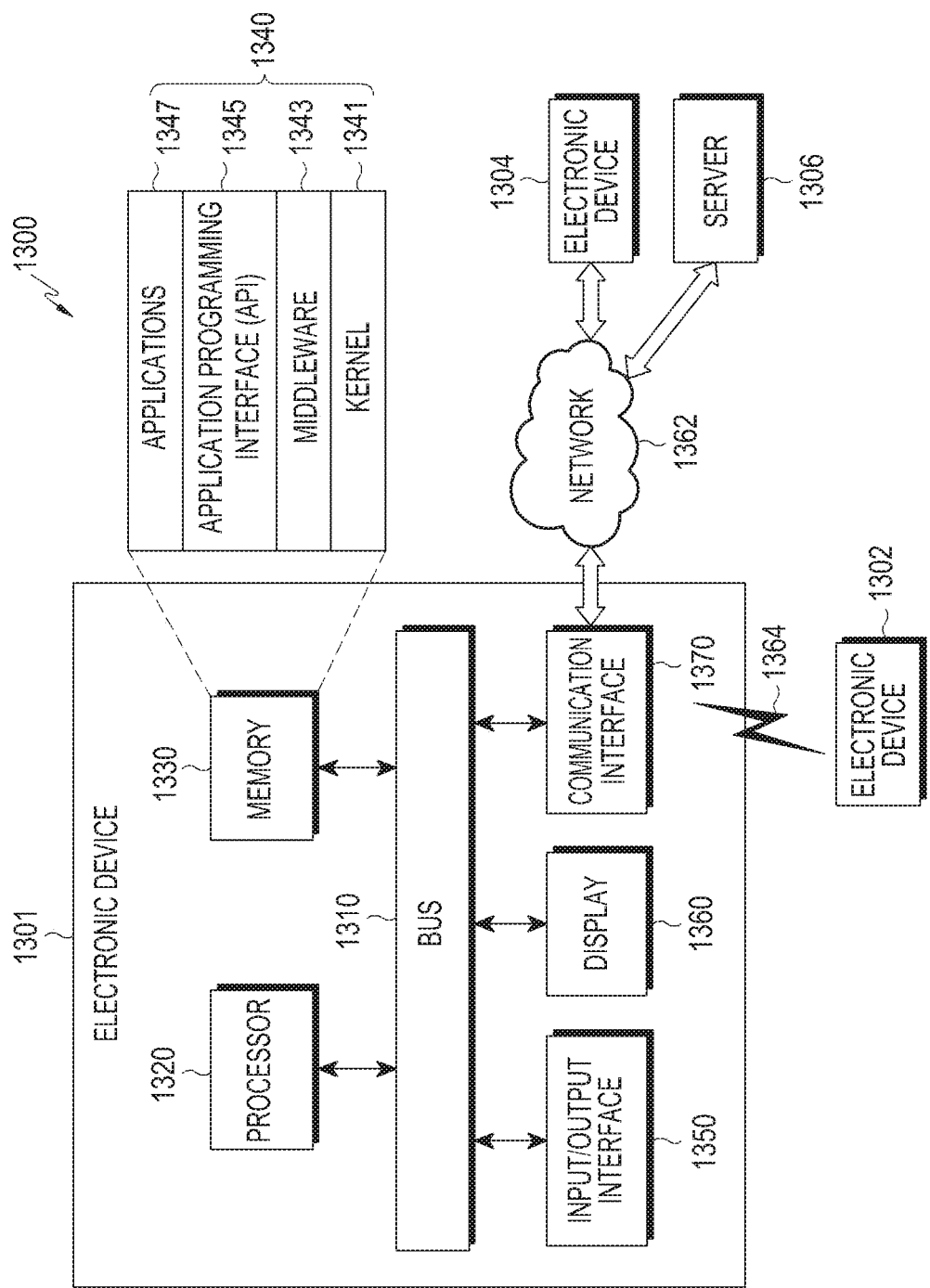
FIG. 13 is a block diagram of an electronic device in a network environment according to various embodiments.

FIG. 13 is a block diagram of an electronic device in a network environment according to various embodiments.

Referring to FIG. 13, an electronic device 1301 in a network environment 1300 according to various embodiments of the disclosure will be described. The electronic device 1301 may include a bus 1310, a processor 1320, a memory 1330, an input/output (I/O) interface 1350, a display 1360, and a communication interface 1370. According to some embodiments, the electronic device 1301 may omit at least one of the foregoing elements or may further include other elements.

The bus 1310 may include a circuit for connecting, e.g., the elements 1310 to 1370 and delivering communication (e.g., a control message and/or data) between the elements 110 to 170.

The processor 1320 may include one or more of a central processing unit (CPU), an application processor (AP), or a communication processor (CP). The processor 1320 performs operations or data processing for control and/or communication of, for example, at least one other elements of the electronic device 1301.

The memory 1330 may include a volatile and/or nonvolatile memory. The memory 1330 may store, for example, instructions or data associated with at least one other elements of the electronic device 1301. According to an embodiment, the memory 1330 may store software and/or a program 1340. The program 1340 may include at least one of, for example, a kernel 1341, middleware 1343, an application programming interface (API) 1345, and/or an application program (or "application") 1347, and the like.

At least some of the kernel 1341, the middleware 1343, or the API 1345 may be referred to as an operating system (OS).

The kernel 1341 may control or manage, for example, system resources (e.g., the bus 1310, the processor 1320, the memory 1330, etc.) used to execute operations or functions implemented in other programs (e.g., the middleware 1343, the API 1345, or the application program 1347). The kernel 1341 provides an interface through which the middleware 1343, the API 1345, or the application program 1347 accesses separate components of the electronic device 1301 to control or manage the system resources.

The middleware 1343 may work as an intermediary for allowing, for example, the API 1345 or the application program 1347 to exchange data in communication with the kernel 1341.

In addition, the middleware 1343 may process one or more task requests received from the application program 1347 based on priorities.

The API 1345 is an interface used for the application 1347 to control a function provided by the kernel 1341 or the middleware 1343, and may include, for example, at least one interface or function (e.g., a command) for file control, window control, image processing or character control.

The I/O interface 1350 serves as an interface for delivering, for example, a command or data input from a user or another external device to other component(s) of the electronic device 1301. The I/O interface 1350 may also output a command or data received from other component(s) of the electronic device 1301 to a user or another external device.

The display 1360 may, for example, display various contents (e.g., a text, an image, video, an icon, a symbol, etc.) to users. The display 1360 may include a touch screen, and receives a touch, a gesture, proximity, or a hovering input, for example, by using an electronic pen or a part of a body of a user.

The communication interface 1370 establishes communication between the electronic device 1301 and an external device (e.g., a first external electronic device 1302, a second external electronic device 1304, or a server 1306). For example, the communication interface 1370 may be connected to a network 1362 through wireless communication or wired communication to communicate with an external device (e.g., the second external electronic device 1304 or the server 1306).

The wireless communication may use, as a cellular communication protocol, for example, at least one of Long-Term Evolution (LTE), LTE-Advanced (LTE-A), Code Division Multiple Access (CDMA), Wideband CDMA (WCDMA), a Universal Mobile Telecommunication System (UMTS), Wireless Broadband (WiBro), or Global System for Mobile Communications (GSM). The wired communication may include, for example, short-range communication 1364. The short-range communication 1364 may include, for example, at least one of Win, Bluetooth, NFC, or GNSS. Depending on a usage area or bandwidth, the GNSS may include, for example, at least one of a global positioning system (GPS), a global navigation satellite system (Glonass), a Beidou navigation satellite system ("Beidou"), and Galileo, and the European global satellite-based navigation system. Hereinbelow, "GPS" may be used interchangeably with "GNSS". The wired communication may include, for example, at least one of USB, a high definition multimedia interface (HDMI), recommended standard232 (RS-232), and a plain old telephone service (POTS). The network 1362 may include a telecommunications network, for example, at least one of a computer network (e.g., a local area network (LAN) or a wide area network (WAN)), Internet, and a telephone network.

Each of the first external electronic device 1302 and the second external electronic device 1304 may be a device of the same type as or a different type than the electronic device 1301. According to an embodiment, the server 1306 may include a group of one or more servers. According to various embodiments of the disclosure, some or all of operations performed by the electronic device 1301 may be performed in another electronic device or a plurality of electronic devices (e.g., the electronic device 1302 or 1304, or the server 1306). According to an embodiment of the disclosure, when the electronic device 1301 has to perform a function or a service automatically or at a request, the electronic device 1301 may request another device (e.g., the electronic devices 1302 or 1304 or the server 1306) to perform at least some functions associated with the function or the service instead of or in addition to executing the function or the service. The another electronic device (e.g., the electronic device 1302 or 1304 or the server 1306) may execute the requested function or additional function and deliver the execution result to the electronic device 1301. The electronic device 1301 may then process or further process the received result to provide the requested function or service. To that end, a cloud computing, distributed computing, or client-server computing technology may be used, for example.

Figure 14:
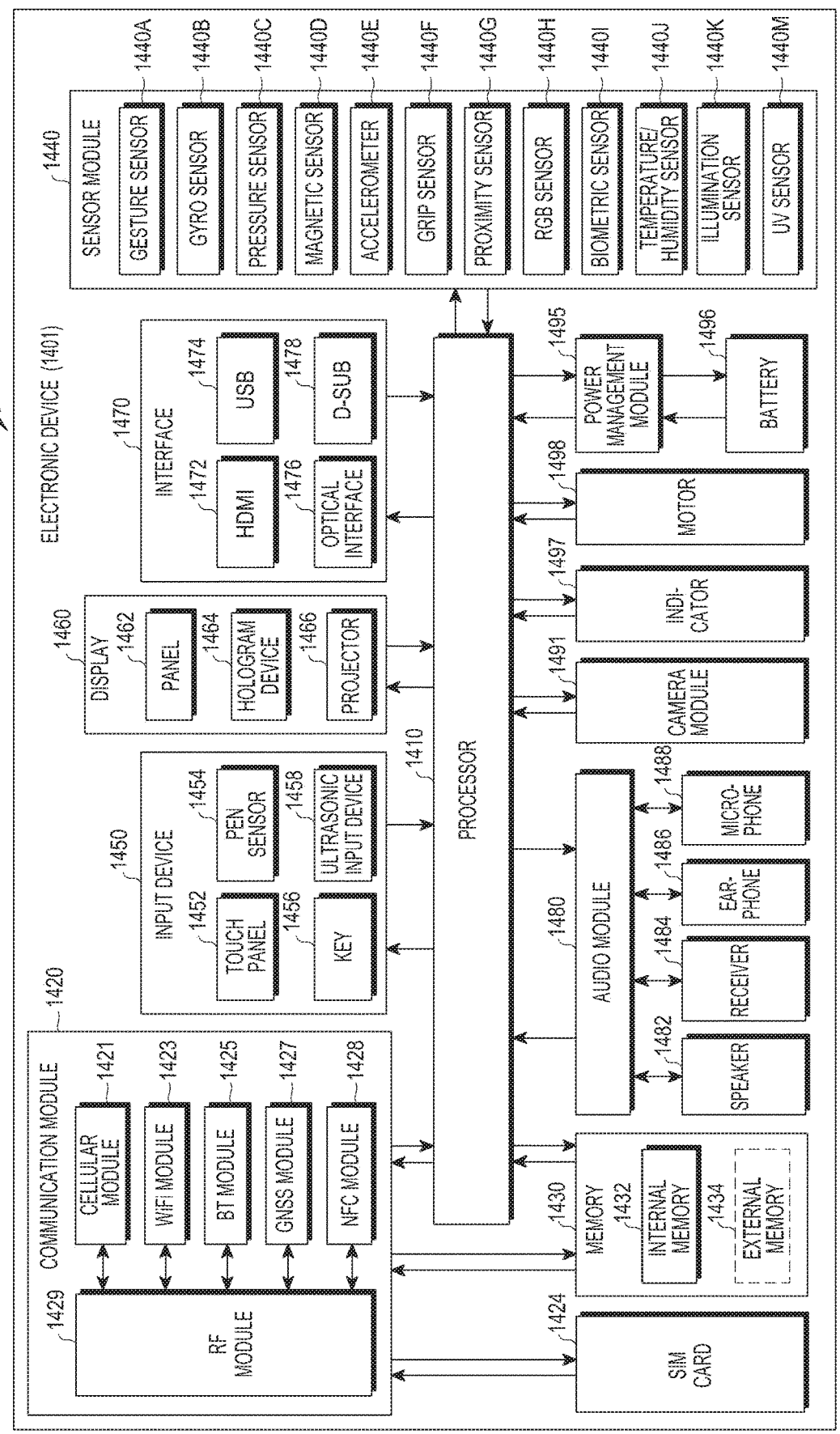
FIG. 14 is a block diagram of an electronic device according to various embodiments of the disclosure.

FIG. 14 is a block diagram of an electronic device 1401 according to various embodiments of the disclosure.

Referring to FIG. 14, the electronic device 1401 may include, for example, all components or some of the electronic device 1301 illustrated in FIG. 13. The electronic device 1401 may include one or more processors (e.g., application processors (APs)) 1410, a communication module 1420, a subscriber identification module (SIM) 1424, a memory 1430, a sensor module 1440, an input device 1450, a display 1460, an interface 1470, an audio module 1480, a camera module 1491, a power management module 1495, a battery 1496, an indicator 1497, and a motor 1498.

The processor 1410 may control multiple hardware or software components connected to the processor 1410 by driving an OS or an application program, and perform processing and Operations with respect to various data. The processor 1410 may be implemented with, for example, a system on chip (SoC). According to an embodiment, the processor 1410 may further include a GPU and/or an image signal processor. The processor 1410 may include at least some of the elements illustrated in FIG. 14 (e.g., the cellular module 1421). The processor 1410 may load a command or data received from at least one of other elements (e.g., a non-volatile memory) into a volatile memory to process the command or data, and store various data in the non-volatile memory.

The communication module 1420 may have a configuration that is the same as or similar to the communication module 1370 illustrated in FIG. 13. The communication module 1420 may include, for example, at least one of the cellular module 1421, a WiFi module 1423, a Bluetooth (BT) module 1425, a GNSS module 1427 (e.g., a UPS module, a Glonass module, a Beidou module, or a Galileo module), an NFC module 1428, and a radio frequency (RF) module 1429.

The cellular module 1421 may provide, for example, a voice call, a video call, a text service, or an Internet service over a communication network. According to an embodiment, the cellular module 1421 identifies and authenticates the electronic device 1401 in a communication network by using the SIM 1424 (e.g., a SIM card). According to an embodiment, the cellular module 1421 may perform at least one of functions that may be provided by the processor 1410. According to an embodiment, the cellular module 1421 may include a communication processor (CP).

Each of the WiFi module 1423, the BT module 1425, the GNSS module 1427, or the NEC module 1428 may include, for example, a processor for processing data transmitted and received by a corresponding module. According to an embodiment, at least some (e.g., two or more) of the cellular module 1421, the WiFi module 1423, the BT module 1425, the GNSS module 1427, or the NFC module 1428 may be included in one integrated chip (IC) or IC package.

The RF module 1429 may, for example, transmit and receive a communication signal (e.g., an RF signal). The RF module 1429 may include a transceiver, a power amp module (PAM), a frequency filter, a low noise amplifier (LNA), or an antenna. According to another embodiment, at least one of the cellular module 1421, the WiFi module 1423, the BT module 1425, the GNSS module 1427, and the NFC module 1428 may transmit and receive an RF signal through the separate RE module.

The SIM card 1424 may include a card including a SIM and/or an embedded SIM.

The memory 1430 the (e.g., the memory 1330) may, for example, include an internal memory 1432 and/or an external memory 1434. The internal memory 1432 may include, for example, at least one of a volatile memory (e.g., a dynamic random access memory (DRAM), static RAM (SRAM), a synchronous dynamic RAM (SDRAM), etc.), and a non-volatile memory (e.g., one time programmable read only memory (OTPROM), programmable ROM (PROM), erasable and programmable ROM (EPROM), electrically erasable and programmable ROM (EEPROM), etc.), mask ROM, flash ROM, NAND flash memory, NOR flash memory, etc.), and a solid state drive (SSD).

The sensor module 1440 measures physical quantity or senses an operation state of the electronic device 1401 to convert the measured or sensed information into an electric signal. The sensor module 1440 may include, for example, at least one of a gesture sensor 1440A, a gyro sensor 1440B, a pressure sensor 1440C, a magnetic sensor 1440D, an acceleration sensor 1440E, a grip sensor 1440F, a proximity sensor 1440G, a color sensor 1440H (e.g., a red, green, blue (RCSB) sensor), a biometric sensor 1440I, a temperature/humidity sensor 1440J, an illumination sensor 1440K, and an ultraviolet (UV) sensor 1440M.

The input device 1450 may include, for example, a touch panel 1452, a (digital) pen sensor 1454, a key 1456, or an ultrasonic input device 1458. The touch panel 1452 may use at least one of a capacitive type, a resistive type, an IR type, or an ultrasonic type. The touch panel 1452 may further include a control circuit. The touch panel 1452 may further include a tactile layer to provide tactile reaction to the user.

The (digital) pen sensor 1454 may include a recognition sheet which is a part of the touch panel 252 or a separate recognition sheet. The key 1456 may include a physical button, an optical key, or a keypad. The ultrasonic input device 1458 senses ultrasonic waves generated by an input means through a microphone (e.g., the microphone 1488) and checks data corresponding to the sensed ultrasonic waves.

The display 1460 (e.g., the display 1360) may include a panel 1462, a hologram device 1464, or a projector 1466. The panel 1462 may have a configuration that is the same as or similar to the display 1360 illustrated in FIG. 13. The panel 1462 may be implemented to be flexible, transparent, or wearable. The panel 1462 may be configured with the touch panel 1452 in one module.

The interface 1470 may include an HDMI 1472, a universal serial bus (USB) 1474, an optical communication 1476, or a D-subminiature 1478. The interface 1470 may be included in the communication interface 1370 illustrated in FIG. 13.

The audio module 1480 may bi-directionally convert sound and an electric signal. At least one element of the audio module 1480 may be included in the I/O interface 1350 illustrated in FIG. 13. The audio module 1480 may process sound information input or output through the speaker 1482, the receiver 1484, the earphone 1486, or the microphone 1488.

The camera module 1491 is a device capable of capturing a still image or a moving image, and according to an embodiment, may include one or more image sensors (e.g., a front sensor or a rear sensor), a lens, an image signal processor (ISP), or a flash (e.g., an LED, a xenon lamp, etc.).

The power management module 1495 manages power of the electronic device 1401.

The battery 1496 may include, for example, a rechargeable battery and/or a solar battery.

The indicator 1497 displays a particular state, for example, a booting state, a message state, or a charging state, of the electronic device 1401 or a part thereof (e.g., the processor 1410). The motor 1498 converts an electric signal into mechanical vibration or generates vibration or a haptic effect.

Each of the foregoing elements described herein may be configured with one or more components, names of which may vary with a type of the electronic device. In various embodiments, the electronic device may include at least one of the foregoing elements, some of which may be omitted or to which other elements may be added. In addition, some of the elements of the electronic device according to various embodiments may be integrated into one entity to perform functions of the corresponding elements in the same manner as before they are integrated.

At least a part of an apparatus (e.g., modules or functions thereof) or a method (e.g., operations) according to various embodiments may be implemented with instructions stored in a computer-readable storage medium in the form of a programming module. When the instructions are executed by one or more processors (for example, the processor 103, the processor 1320, or the processor 1410), the one or more processors may perform functions corresponding to the instructions. The computer-readable storage medium may be, for example, a memory (e.g., the memory 104, the memory 1330, or the memory 1430).

The computer readable recording medium may include a hard disk, a floppy disk, or magnetic media (e.g., a magnetic tape, optical media (e.g., compact disc read only memory (CD-ROM) or digital versatile disc (DVD), magneto-optical media (e.g., floptical disk), a hardware device (e.g., ROM, RAM, flash memory, etc.), and so forth. Further, the program instructions may include a machine language code created by a complier and a high-level language code executable by a computer using an interpreter. The foregoing hardware device may be configured to be operated as at least one software module to perform an operation of the disclosure, or vice versa.

Modules or programming modules according to various embodiments of the disclosure may include one or more of the foregoing elements, have some of the foregoing elements omitted, or further include additional other elements. Operations performed by the modules, the programming modules or other elements according to various embodiments may be executed in a sequential, parallel, repetitive or heuristic manner. Also, some of the operations may be executed in different order or omitted, or may have additional different operations.

The embodiments disclosed herein have been provided for description and understanding of disclosed technical matters, and are not intended to limit the scope of the disclosure. Therefore, it should be construed that the scope of the disclosure includes any change or other various embodiments based on the technical spirit of the disclosure.

The invention claimed is:

1. A method for storing user data corresponding to an input using an electronic pen by an electronic device which provides a display region, the method comprising:
   receiving, through a communication module of the electronic device, a first event signal from the electronic pen, wherein the first event signal is generated when a member included in the electronic pen is pressed;
   entering a first mode, based on the first event signal, in which a transparent layer for receiving first memo input data or first handwriting input data is activated;
   obtaining, while in the first mode, first user data corresponding to a first pen input, upon sensing the first pen input using the electronic pen against the display region where first screen data is displayed, wherein the first screen data is a part of screen data, wherein the first user data includes the first memo input data or the first handwriting input data;
   displaying, while in the first mode, second screen data in the display region based on a first user input, by an object different from the electronic pen against the display region, wherein the second screen data is another part of the screen data;
   obtaining, while in the first mode, second user data corresponding to a second pen input, upon sensing the second pen input using the electronic pen against the display region where the second screen data is displayed, wherein the second user data includes second memo input data or second handwriting input data;
   receiving, through the communication module while in the first mode, a second event signal through the communication module from the electronic pen after the first user data and the second user data are obtained, wherein the second event signal is generated when the member included in the electronic pen is pressed;
   displaying third screen data in the display region based on a second user input, by the object different from the electronic pen against the display region, wherein the third screen data is the other part of the screen data;
   obtaining third user data corresponding to a third pen input, upon sensing the third pen input using the electronic pen against the display region where the third screen data is displayed, wherein the third user data includes third memo input data or third handwriting input data;
   exiting the first mode based on the second event signal; and
   storing the first user data, the second user data, and the third user data such that the first user data is set to overlap the first screen data, the second user data is set to overlap the second screen data, and the third user data is set to overlap the third screen data.

2. The method of claim 1, wherein the storing of the first user data associatively with the second user data comprises storing screen data comprising the first user data and the second user data overlappingly with the first user data and the second user data.

3. The method of claim 1, wherein the storing of the first user data associatively with the second user data comprises storing the first user data associatively with the second user data in a hierarchical structure.

4. The method of claim 1, wherein the second event signal corresponding to the first event signal is a second event signal generated by user manipulation with respect to the member included in the electronic pen.

5. The method of claim 1,
wherein the obtaining of the first user data comprises displaying the first user data together with first screen data in the display region, and
wherein the obtaining of the second user data comprises displaying the second user data together with the second screen data in the display region.

6. The method of claim 1, further comprising displaying in the display region, an indicator indicating that the electronic device operates in the first mode, while operating in the first mode.

7. The method of claim 1, further comprising displaying a user interface (UI) menu for selecting a scheme to store the obtained first user data and the obtained second user data, based on the received second event signal.

8. The method of claim 1, wherein screen data is data which forms a web screen, an application execution screen, a content execution screen, or a home screen.

9. The method of claim 1, wherein first user data and second user data include data associated with at least one of writing, drawing, text typing, underlining, or marking.

10. The method of claim 1, wherein the first user input against the display region is a user input to scroll on the display region.

11. An electronic device comprising:
a display configured to provide a display region;
a pen sensing module configured to sense a pen input using an electronic pen;
a processor electrically connected to the display and the pen sensing module; and
a memory electrically connected to the processor,
wherein the memory stores instructions for causing the processor, when executed, to:
    enter a first mode, based on a first event signal generated when a member included in the electronic pen is pressed, in which a transparent layer for receiving first memo input data or first handwriting input data is activated,
    obtain, while in the first mode, first user data corresponding to a first pen input when the pen sensing module senses the first pen input using the electronic pen against the display region where first screen data is displayed, wherein the first screen data is a part of screen data, wherein the first user data includes the first memo input data or the first handwriting input data,
    display, while in the first mode, second screen data in the display region based on a first user input, by an object different from the electronic pen against the display region, wherein the second screen data is another part of the screen data,
    obtain, while in the first mode, second user data corresponding to a second pen input when the pen sensing module senses the second pen input using the electronic pen against the display region where second screen data is displayed, wherein the second user data includes second memo input data or second handwriting input data,
    receive, through a communication module while in the first mode, a second event signal through the communication module from the electronic pen after the first user data and the second user data are obtained,
    display third screen data in the display region based on a second user input, by the object different from the electronic pen against the display region, wherein the third screen data is the other part of the screen data,
    obtain third user data corresponding to a third pen input, upon sensing the third pen input using the electronic pen against the display region where the third screen data is displayed, wherein the third user data includes third memo input data or third handwriting input data,
    exit the first mode based on the second event signal, and
    store the first user data, the second user data, and the third user data in the memory based on a second event signal corresponding to the first event signal received through the communication module from the electronic pen after the first user data, the second user data, and the third user data are obtained,
    wherein the second event signal is generated when the member included in the electronic pen is pressed.

12. The electronic device of claim 11, wherein the first user data and the second user data are overlappingly with the first user data and the second user data.

13. The electronic device of claim 11, wherein the first user data is associatively with the second user data in a hierarchical structure.

14. The electronic device of claim 11, wherein the second event signal corresponding to the first event signal is a second event signal generated by user manipulation with respect to the member included in the electronic pen.

15. The electronic device of claim 11,
wherein the obtaining of the first user data comprises displaying the first user data together with first screen data in the display region, and
wherein the obtaining of the second user data comprises displaying the second user data together with the second screen data in the display region.

* * * * *